(12) United States Patent
Han et al.

(10) Patent No.: US 10,126,988 B1
(45) Date of Patent: Nov. 13, 2018

(54) ASSIGNING RAID EXTENTS AND CHANGING DRIVE EXTENT ALLOCATIONS WITHIN RAID EXTENTS WHEN SPLITTING A GROUP OF STORAGE DRIVES INTO PARTNERSHIP GROUPS IN A DATA STORAGE SYSTEM

(71) Applicant: EMC IP Holding Company LLC, Hopkinton, MA (US)

(72) Inventors: Geng Han, Beijing (CN); Jian Gao, Beijing (CN); Ilya Usvyatsky, Northborough, MA (US); Hongpo Gao, Beijing (CN); Jibing Dong, Beijing (CN); Yousheng Liu, Beijing (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/662,478

(22) Filed: Jul. 28, 2017

(51) Int. Cl.
*G06F 12/00* (2006.01)
*G06F 3/06* (2006.01)
*G06F 17/16* (2006.01)
*G06F 17/18* (2006.01)
*G06F 17/30* (2006.01)
*G06F 17/50* (2006.01)

(52) U.S. Cl.
CPC .......... *G06F 3/0689* (2013.01); *G06F 17/16* (2013.01); *G06F 17/18* (2013.01); *G06F 17/30917* (2013.01); *G06F 17/505* (2013.01)

(58) Field of Classification Search
CPC ........ G06F 3/0689; G06F 17/16; G06F 17/18
USPC ....................................................... 711/114
See application file for complete search history.

(56) References Cited

U.S. PATENT DOCUMENTS

| 5,579,475 A | 11/1996 | Blaum et al. |
| 6,567,889 B1 | 5/2003 | DeKoning et al. |
| 6,857,059 B2 | 2/2005 | Karpoff et al. |
| 7,409,625 B2 | 8/2008 | Corbett et al. |
| 2004/0260967 A1 | 12/2004 | Guha et al. |

(Continued)

OTHER PUBLICATIONS

Blaum, et al., "EVENODD: An Optical Scheme for Tolerating Double Disk Failures in RAID Architectures", RAID Architectures: IBM Research Report, RJ 9506, Sep. 1993, pp. 245-254.

(Continued)

*Primary Examiner* — Jae Yu
(74) *Attorney, Agent, or Firm* — BainwoodHuang

(57) ABSTRACT

Techniques are provided within a mapped RAID (Redundant Array of Independent Disks) system for assigning RAID extents to partnership groups and changing drive extent indications within RAID extents when splitting a group of storage drives into partnership groups. RAID extents are assigned to a RAID extent group corresponding to a newly created partnership group from a subset of RAID extents that contain RAID extents indicating higher total numbers of drive extents located in the physical data storage devices contained in the partnership group. When changing drive extent indications in RAID extents, new drive extents may be allocated to replace drive extents located outside of a partnership group such that a resulting variance in the values of a neighborhood matrix for the partnership group is minimized, to ensure that RAID extents are evenly distributed across the drives in the corresponding partnership group, to prevent drive rebuild performance from being compromised.

19 Claims, 14 Drawing Sheets

(56) References Cited

U.S. PATENT DOCUMENTS

| | | |
|---|---|---|
| 2006/0075283 A1 | 4/2006 | Hartung et al. |
| 2012/0072680 A1* | 3/2012 | Kimura ................ G06F 11/108 <br> 711/154 |
| 2012/0137065 A1 | 5/2012 | Odenwald et al. |

OTHER PUBLICATIONS

Miller, Scott A., "Comparing RAID 10 and Raid 01", SMB IT Journal; Jul. 30, 2014; <<http://www.smbitjournal.com/2014/07/comparing-raid-10-and-raid-01/>>article accessed Mar. 21, 2017, 6 pages.

Patterson, et al., "A Case for Redundant Arrays of Inexpensive Disks (RAID)", Proceedings of the 1988 ACM SIGMOD International Conference on Management of Data, ACM, 1988, pp. 109-116.

Perumal, et al., "A Tutorial on RAID Storage Systems", CS04-05-00. May 6, 2004. Data Network Architectures Group. Department of Computer Science. University of Capetown, 23 pages.

\* cited by examiner

… (1)

ASSIGNING RAID EXTENTS AND CHANGING DRIVE EXTENT ALLOCATIONS WITHIN RAID EXTENTS WHEN SPLITTING A GROUP OF STORAGE DRIVES INTO PARTNERSHIP GROUPS IN A DATA STORAGE SYSTEM

TECHNICAL FIELD

The present disclosure relates generally to intelligent data storage systems that provide RAID (Redundant Array of Independent Disks) technology, and more specifically to technology for assigning RAID extents and changing drive extent allocations within RAID extents when splitting a group of storage drives into partnership groups in a data storage system that uses mapped RAID technology.

BACKGROUND

Data storage systems are arrangements of hardware and software that typically include multiple storage processors coupled to arrays of non-volatile data storage devices, such as magnetic disk drives, electronic flash drives, and/or optical drives. The storage processors service host I/O operations received from host machines. The received I/O operations specify one or more storage objects (e.g. logical disks or "LUNs") that are to be written, read, created, or deleted. The storage processors run software that manages incoming I/O operations and performs various data processing tasks to organize and secure the host data that is received from the host machines and stored on the non-volatile data storage devices.

Some existing data storage systems have provided RAID (Redundant Array of Independent Disks) technology. As it is generally known, RAID is a data storage virtualization/protection technology that combines multiple physical drives into a single logical unit to provide data redundancy and/or performance improvement. Data may be distributed across the drives in one of several ways, referred to as RAID levels, depending on the required levels of redundancy and performance. Some RAID levels employ data striping ("striping") to improve performance. In general, striping involves segmenting received host data into logically sequential blocks (e.g. sequential blocks of an address space of a logical storage object), and then storing data written to consecutive blocks in the logical sequence of blocks onto different drives. A series of consecutive logically sequential data blocks that are stored across different drives is referred to as a RAID "stripe". By spreading data segments across multiple drives that can be accessed concurrently, total data throughput can be increased.

Some RAID levels employ a "parity" error protection scheme to provide fault tolerance. When parity protection is used, one or more additional parity blocks are maintained in each stripe. For example, a parity block for a stripe may be maintained that is the result of performing a bitwise exclusive "OR" (XOR) operation across the data blocks of the stripe. When the storage for a data block in the stripe fails, e.g. due to a drive failure, the lost data block can be recovered by performing an XOR operation across the remaining data blocks and the parity block.

One example of a RAID configuration that uses block level striping with distributed parity error protection is 4D+1P ("four data plus one parity") RAID-5. In 4D+1P RAID-5, each stripe consists of 4 data blocks and a block of parity information. In a traditional 4D+1P RAID-5 disk group, at least five storage disks are used to store the data and parity information, so that each one of the four data blocks and the parity information for each stripe can be stored on a different disk. A spare disk is also kept available to handle disk failures. In the event that one of the disks fails, the data stored on the failed disk can be rebuilt onto the spare disk by performing XOR operations on the remaining data blocks and the parity information on a per-stripe basis. 4D+1P RAID-5 is generally considered to be effective in preventing data loss in the case of single disk failures. However, data may be lost when two or more disks fail concurrently.

Other RAID configurations may provide data protection even in the event that multiple disks fail concurrently. For example, RAID-6 provides striping with double distributed parity information that is provided on a per-stripe basis. The double parity information maintained by RAID-6 enables data protection for up to a maximum of two concurrently failing drives.

SUMMARY

Traditional data storage systems providing RAID data protection have exhibited significant limitations with regard to the ability to add new disks, and with regard to the amount of time required to rebuild data onto a replacement disk in the event of a disk failure. Specifically, traditional RAID systems do not support the addition of new disks on an individual disk basis, instead requiring that new storage capacity be added only in increments equal to the number of disks that is required to support the specific RAID configuration, i.e. equal to the width of the RAID stripe being used. Accordingly, for 4D+1P RAID-5 configurations, new disks can only be added to a traditional RAID system in increments of five disks at a time. For RAID-6 configurations, new disks can only be added to traditional RAID systems in increments of six disks. As the capacity of individual disks has increased over time with the introduction of new storage technologies, this inflexibility in terms of adding new capacity to traditional RAID systems has become increasingly burdensome and impractical.

Also as individual disk capacity has increased, the time required by traditional RAID systems to rebuild data of an entire failed disk onto a single spare disk has increased, and the write bandwidth of the single spare disk has become a significant performance bottleneck with regard to total rebuild time. Moreover, while data stored previously stored on the failed disk is being rebuilt on the spare disk, concurrent failure of one or more additional disks in a traditional RAID system during the rebuilding process may introduce the risk of data loss.

Mapped RAID technology improves on traditional RAID technology by allowing for the addition of individual storage drives to a data storage system in order to increase storage capacity, and also addresses the problem of increased rebuild times caused by write bandwidth bottlenecks in dedicated spare disks. In mapped RAID technology, physical data storage drives are divided into contiguous regions of non-volatile data storage referred to as "drive extents" that are allocated from a drive extent pool. A RAID mapping table organizes the allocated drive extents into "RAID extents" that indicate the allocated drive extents. Each RAID extent indicates a set of drive extents allocated from the drive extent pool, and each drive extent allocated to a given RAID extent may be located on a different physical drive. The drive extents indicated by a RAID extent are used to store the blocks of data and parity information for a stripe of data storage represented by the RAID extent. Accordingly, the number of drive extents indicated by each RAID extent may be the same as the number of disks used in a traditional RAID system to store data blocks and parity information for the same RAID level. For example, in a mapped RAID group supporting a 4D+1P RAID-5 configuration, each RAID extent indicates a total of five drive extents that are used to store the four blocks of data and the parity information block of the stripe represented by the RAID extent. In a RAID-6 configuration of mapped RAID, two parity information blocks are indicated by each RAID extent to provide an increased level of fault tolerance, and each RAID extent indicates a total of six drive extents.

In the event that a drive fails when using mapped RAID, spare drive extents can be allocated that are located on multiple physical drives contributing to the drive extent pool in order to replace the drive extents from the failed drive, thus spreading the rebuild read and write operations across multiple physical drives, and eliminating the write bandwidth bottleneck previously caused by traditional RAID's reliance on rebuilding to a single spare physical data storage drive. In this way, mapped RAID can generally reduce rebuild time in the face of a single drive failure. Moreover, as the number of physical data storage drives increases, the amount of concurrent processing that can be used during the rebuild process also increases, resulting in progressively improving rebuild performance for increasing numbers of physical data storage drives that are used to support a given RAID configuration.

However, while increasing the number of physical data storage drives that are used to support a mapped RAID configuration may, up to a point, increase rebuild performance due to the increased ability to spread the rebuild process across larger numbers of physical data storage drives, each physical data storage drive added to the group of physical data storage drives has its own independent probability of failure at any specific time. Accordingly, the probability of one or more additional drives failing at any point in time during the rebuild process also increases as more drives are added to the group. When the total number of physical data storage drives reaches a sufficiently large number, the level of concurrent processing available during the rebuild process is no longer limited by the number of physical drives, and instead becomes limited by the availability and/or performance of one or more resources in the data storage system other than the physical drives, e.g. the availability and/or performance of the storage system CPUs, the availability and/or performance of the storage system memory, etc. After the number of physical drives reaches such a maximum effective number, simply allowing more physical drives to be added still continues to increase the probability of one or more additional drives failing during the rebuild process, without providing further improvement in rebuild time performance. Previous systems that have simply allowed the indefinite addition of more and more individual physical data storage drives have therefore caused the risk of data loss to be continuously increased, without recognizing that rebuild time performance will eventually be limited predominantly by factors other than the number of physical data storage drives that can participate in the rebuilding process.

Mapped RAID technology may respond to the total number of physical drives in a group of physical drives exceeding a predetermined maximum by splitting the group into partnership groups, in order to limit the risk of data loss occurring during drive rebuilds in the event of a drive failure. For example, a RAID mapping table may be generated that contains multiple RAID extents, and each RAID extent in the RAID mapping table may indicate multiple drive extents allocated from a group of data storage drives that are used to persistently store host data written to a storage object. When the data storage system detects that a new physical data storage drive has been added to the group of physical data storage drives, and the resulting total number of physical data storage drives in the group exceeds a maximum drive group size, the group of physical data storage drives may be divided into multiple partnership groups of physical data storage drives. Each physical data storage drive from the group of physical data storage drives is contained in only one of the partnership groups of physical data storage drives, and each partnership group of physical data storage drives contains a number of physical data storage drives that is less than the maximum drive group size. Further in response to detecting that the total number of physical data storage drives in the group of physical data storage drives exceeds the maximum drive group size, individual RAID extents in the RAID mapping table are assigned to distinct RAID extent groups, where each one of the RAID extent groups corresponds to one of the partnership groups. In order to support the corresponding partnership groups of physical data storage drives, each RAID extent assigned to a RAID extent group must only indicate physical data storage drives that are contained in the corresponding partnership group of physical data storage drives. In the case where a RAID extent assigned to a RAID extent group indicates a drive extent contained in a partnership group other than the partnership group corresponding to the RAID extent group, the RAID extent must be modified to indicate a new drive extent allocated from the spare drive extents contained in the partnership group corresponding to the RAID extent group, and the data stored on the drive extent contained in the partnership group other than the partnership group corresponding to the RAID extent group copied to the new drive extent.

Significant system performance considerations arise when assigning RAID extents to RAID extent groups in response to splitting a group of storage drives into partnership groups. First, since each change in drive extent allocation within a RAID extent requires copying data from a previously allocated drive extent to a newly allocated drive extent, changes in drive extent allocation should be minimized to avoid adversely impacting overall system performance. Second, since failed drive rebuild performance improves with the number of different storage drives that can participate in the rebuilding process, drive extents allocated to RAID extents in a RAID extent group should be evenly allocated across the storage drives in the partnership group corresponding to the RAID extent group to enable large numbers of storage drives to participate in the rebuilding process in the event of a drive failure.

To address these performance considerations and shortcomings of previous solutions, new technology is disclosed herein for providing RAID (Redundant Array of Independent Disks) data protection for a storage object in a data storage system. In the disclosed technology, a RAID mapping table is generated that contains multiple RAID extents. Each RAID extent contained in the RAID mapping table indicates a predetermined number of drive extents for persistently storing host data written to the storage object. The number of drive extents indicated by each RAID extent depends on the RAID configuration. For example, in a mapped RAID group supporting a 4D+1P RAID-5 configuration, each RAID extent indicates a total of five drive extents. In another example, in a RAID-6 configuration, each RAID extent indicates a total of six drive extents. Each drive extent is a contiguous region of non-volatile data storage located on one of the physical storage drives contained in an initial group of storage drives.

The initial group of physical data storage drives is split into a first partnership group of physical data storage drives and a second partnership group of physical data storage drives. A subset of the RAID extents in the RAID mapping table is identified that consists of a number of RAID extents that each indicate a higher total number of drive extents located on the physical data storage devices contained in the first partnership group than any RAID extent in the RAID mapping table that is not included in the subset. A first RAID extent group corresponding to the first partnership group is created by assigning the RAID extents in the subset of RAID extents to the first RAID extent group, and a second RAID extent group corresponding the second partnership group is created by assigning all RAID extents in the RAID mapping table other than the RAID extents in the subset of RAID extents to the second RAID extent group.

In some embodiments, the subset of the RAID extents in the RAID mapping table that consists of the RAID extents that each indicate a higher total number of drive extents located in the physical data storage devices contained in the first partnership group than any RAID extent in the RAID mapping table not included in the subset may be identified by i) calculating a total capacity of the first partnership group equal to the total number of disk extents allocated from the first partnership group to all RAID extents in the RAID mapping table, ii) calculating a total number of RAID extents to be assigned to the first RAID extent group equal to the total capacity of the first partnership group divided by the number of drive extents indicated by each RAID extent, iii) generating, for each RAID extent in the RAID mapping table, a corresponding first partnership group drive extent count equal to a total number of drive extents indicated by the RAID extent that are contained in the first partnership group, iv) generating a sorted list of RAID extents by sorting the RAID extents in descending order of corresponding first partnership group drive extent count, and v) selecting a number of RAID extents located at the top of the sorted list of RAID extents that is equal to the total number of RAID extents to be assigned to the first RAID extent group.

In some embodiments, the disclosed technology modifies at least one drive extent indication in at least one of the RAID extents to reflect the splitting of the initial group of physical data storage drives into the first partnership group and the second partnership group. For example, the disclosed technology may select, from among the first partnership group and the second partnership group, a destination partnership group and a source partnership group. The disclosed technology may select the destination partnership group and the source partnership group by i) comparing a total number of free drive extents in the first partnership group to a total number of free drive extents in the second partnership group, ii) selecting the one of the first partnership group and the second partnership group having a larger total number of free drive extents as the destination partnership group, and iii) selecting the one of the first partnership group and the second partnership group having a smaller total number of free drive extents as the source partnership group. The disclosed technology may then identify a drive extent to be released that is located on one of the physical data storage drives contained in the source partnership group and is allocated to a RAID extent in the RAID extent group corresponding to the destination partnership group. A new drive extent may then be allocated from the free drive extents in the destination partnership group to the RAID extent in the RAID extent group corresponding to the destination partnership group. The data stored on the drive extent to be released may then be copied to the new drive extent, and the RAID extent in the RAID extent group corresponding to the destination partnership group modified to indicate the new drive extent instead of the drive extent to be released. The drive extent to be released may then be released to the free drive extents in the source partnership group.

In some embodiments, the disclosed technology may allocate the new drive extent from the free drive extents in the destination partnership group by first generating a neighborhood matrix for the destination partnership group. Each element in the neighborhood matrix for the destination partnership group corresponds to a pair of drives contained in the destination partnership group and stores a value equal to a total number of RAID extents in the RAID extent group corresponding to the destination partnership group that indicate both i) at least one drive extent located on a first one of the drives in the pair of drives corresponding to the element, and ii) at least one drive extent located on a second one of the drives in the pair of drives corresponding to the element. The disclosed technology may then generate a list of candidate drives that are contained in the destination partnership group, where each one of the candidate drives has located thereon at least one free drive extent. The disclosed technology may then assign, to each one of the candidate drives, a variance weighting that is equal to a variance of the values of the elements in the neighborhood matrix for the destination partnership group resulting from modifying the neighborhood matrix to indicate that the new drive extent was allocated from the candidate drive. One of the candidate drives may then be selected that has the lowest assigned variance weighting, and the new drive extent may be allocated from the candidate drive having the lowest assigned variance weighting.

Embodiments of the disclosed technology may provide significant advantages over previous technical solutions. By assigning RAID extents to a RAID extent group corresponding to a newly created partnership group from a subset of RAID extents that contain RAID extents indicating higher total numbers of drive extents located in the physical data storage devices contained in the partnership group, the disclosed technology minimizes the amount of data that must be copied from previously allocated drive extents to newly allocated drive extents in order to accommodate the newly created partnership group. In addition, by modifying at least one drive extent indication in at least one of the RAID extents in a RAID extent group to reflect the splitting of the initial group of physical data storage drives into the first partnership group and the second partnership group by allocating a new drive extent to replace a drive extent located outside of a corresponding partnership group such that a resulting variance in the values of a neighborhood matrix for the partnership group is minimized, the disclosed technology may be embodied to provide a high level of rebuild performance by ensuring that RAID extents are evenly distributed across the drives in the partnership group, so that larger numbers of storage drives are able to participate in the drive rebuilding process in the event of a drive failure in the partnership group.

BRIEF DESCRIPTION OF THE DRAWINGS

The foregoing and other objects, features and advantages will be apparent from the following description of particular embodiments of the present disclosure, as illustrated in the accompanying drawings in which like reference characters refer to the same parts throughout the different views. The drawings are not necessarily to scale, emphasis instead being placed upon illustrating the principles of various embodiments of the present disclosure.

DETAILED DESCRIPTION

Embodiments of the invention will now be described. It should be understood that the embodiments described below are provided only as examples, in order to illustrate various features and principles of the invention, and that the invention is broader than the specific embodiments described below.

Figure 1:
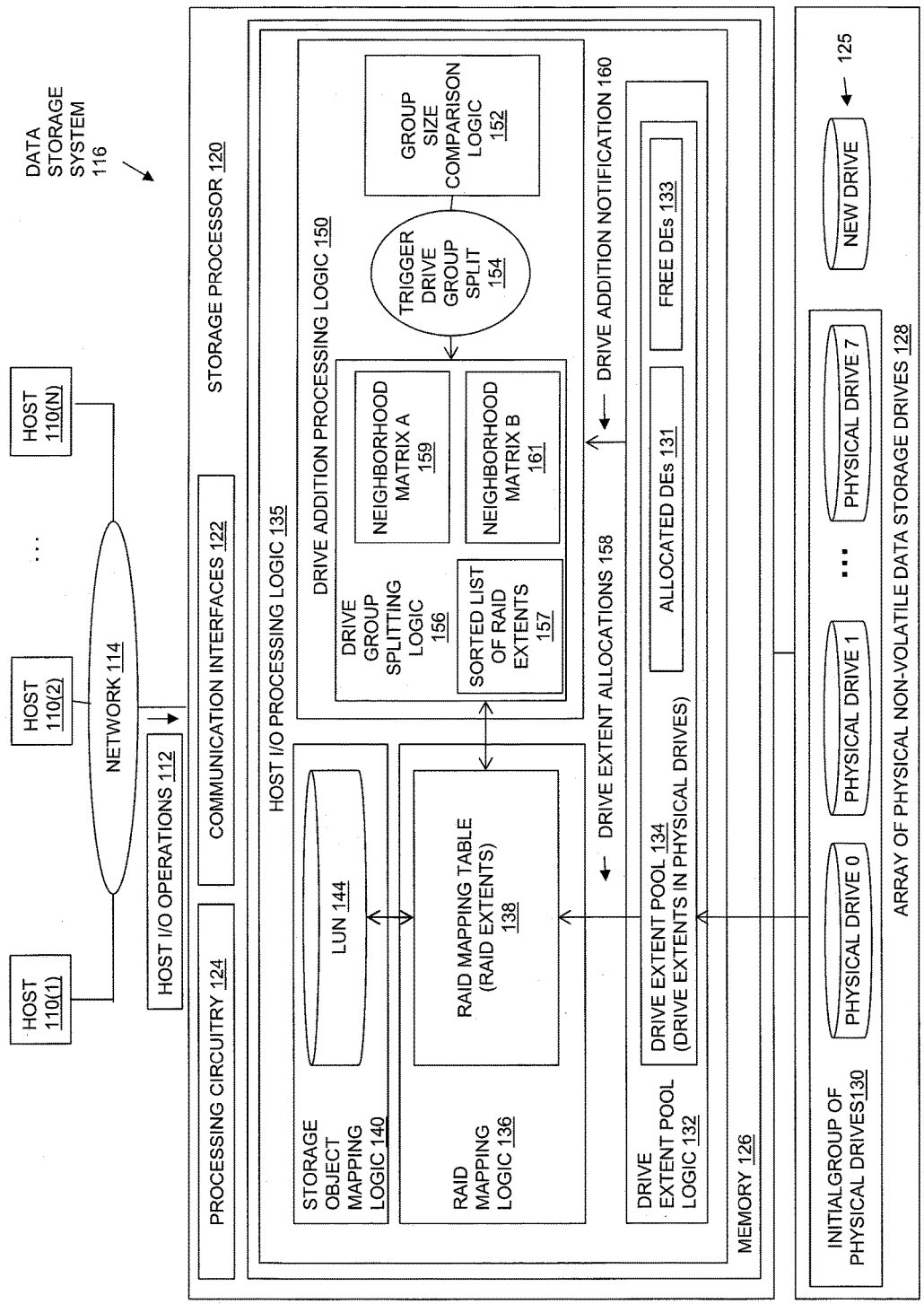
FIG. 1 is a block diagram showing a first view of operational environment for the disclosed technology, including an example of a data storage system in which the disclosed technology may be embodied, with an initial group of physical data storage drives and a newly added physical data storage drive.

FIG. 1 is a block diagram showing an operational environment for the disclosed technology, including an example of a data storage system in which the disclosed technology may be embodied. The data storage environment of FIG. 1 includes some number of Host Computing Devices 110, referred to as "hosts" and shown for purposes of illustration by Hosts 110(1) through 110(N), that access data storage provided by Data Storage System 116, for example over one or more computer networks, such as a local area network (LAN), and/or a wide area network (WAN) such as the Internet, etc., shown in FIG. 1 by Network 114. Data Storage System 116 includes at least one Storage Processor 120 and an Array of Non-Volatile Data Storage Drives 128. Storage Processor 120 may, for example, be provided as a circuit board assembly, or "blade," which plugs into a chassis that encloses and cools multiple storage processors, and that has a backplane for interconnecting storage processors. However, no particular hardware configuration is required, and Storage Processor 120 may be embodied as any specific type of computing device capable of processing host input/output (I/O) operations received from Hosts 110 (e.g. I/O read and I/O write operations, create storage object operations, delete storage object operations, etc.).

The Array of Non-Volatile Data Storage Drives 128 may include physical data storage drives such as magnetic disk drives, solid state drives, hybrid drives, and/or optical drives. Array of Non-Volatile Data Storage Drives 128 may be directly physically connected to and/or contained within Storage Processor 120, and/or may be communicably connected to Storage Processor 120 by way of one or more computer networks, e.g. including or consisting of a Storage Area Network (SAN) or the like.

A Memory 126 in Storage Processor 120 stores program code that is executable on Processing Circuitry 124. Memory 126 may include volatile memory (e.g. RAM), and/or other types of memory. The Processing Circuitry 124 may, for example, include or consist of one or more microprocessors, e.g. central processing units (CPUs), multi-core processors, chips, and/or assemblies, and associated circuitry. Processing Circuitry 124 and Memory 126 together form control circuitry, which is configured and arranged to carry out various methods and functions as described herein. The Memory 126 stores a variety of software components that may be provided in the form of executable program code. For example, as shown in FIG. 1, Memory 126 may include software components such as Host I/O Processing Logic 135. When the program code is executed by Processing Circuitry 124, Processing Circuitry 124 is caused to carry out the operations of the software components. Although certain software components are shown and described for purposes of illustration and explanation, those skilled in the art will recognize that Memory 126 may include various other software components, such as an operating system, various applications, processes, etc.

During operation, Drive Extent Pool Logic 132 initially generates Drive Extent Pool 134 by first dividing each one of the physical data storage drives in the Group of Physical Drives 130 into multiple, equal size drive extents, each of which consists of physically contiguous non-volatile data storage located on a drive. For example, Drive Extent Pool Logic 132 may divide each one of the physical data storage drives in the Array of Physical Non-Volatile Data Storage Devices 128 into a fixed number of equal size drive extents of physically contiguous non-volatile storage, and add each one of the resulting drive extents to Drive Extent Pool 134. The drive extents in Drive Extent Pool 134 may each either be i) one of Allocated Drive Extents 131 that are allocated to a RAID extent in the RAID Mapping Table 138, or ii) one of Free Drive Extents 133 that are unallocated "spare" drive extents available for future allocation to RAID extents in RAID Mapping Table 138, e.g. in response to a failure condition, to replace, within RAID extents in RAID Mapping Table 138, drive extents located on a failed drive in the Initial Group of Physical Drives 130, and/or as new drive extents used to replace previously allocated drive extents when modifying RAID extents to reflect the splitting of the Initial Group of Physical Drives 130 into multiple partnership groups, as described herein.

The Initial Group of Physical Drives 130 from which Drive Extent Pool 134 is generated may consist of all the physical data storage drives in Array of Physical Non-Volatile Data Storage Drives 128, or only a subset of the physical data storage drives in Array of Physical Non-Volatile Data Storage Drives 128. Accordingly, the disclosed techniques may be embodied such that Array of Physical Non-Volatile Data Storage Drives 128 includes multiple separate groups of physical data storage drives, each one of which may be used to independently generate a separate pool of drive extents, and that may be split into partnership groups, as described herein.

The size of the drive extents into which the physical drives in the Initial Group of Physical Drives 130 are divided is the same for every physical data storage drive in the Group of Physical Drives 130. Various specific sizes of drive extents may be used in different embodiments. For example, in some embodiments each drive extent may have a size of 10 gigabytes. Larger or smaller drive extent sizes may be used in the alternative. Any specific number of physical data storage drives may be contained in the Initial Group of Physical Drives 130 and divided into equal size drive extents to generate Drive Extent Pool 134. The physical data storage drives in the Initial Group of Physical Drives 130 may each have the same total capacity, and may accordingly each be divided into the same number of drive extents. Alternatively, the physical data storage drives in Initial Group of Physical Drives 130 may have a variety of different capacities, resulting in different physical data storage drives being divided into different numbers of equal size drive extents.

After dividing each one of the physical data storage drives in the Initial Group of Physical Drives 130 into multiple, equal size drive extents of physically contiguous non-volatile data storage, and adding the resulting drive extents to Drive Extent Pool 134, drive extents may be allocated to specific RAID extents contained in RAID Mapping Table 138, to be used to store host data directed to the RAID extents to which they are allocated, as shown at reference number 158 of FIG. 1. For example, a drive extent may be allocated from Drive Extent Pool 134 to a specific RAID extent contained in RAID Mapping Table 138 in response to an allocation request from RAID Group Mapping Logic 136, and then used to store host data that is directed to LUN 144 and mapped to that specific RAID extent.

In some embodiments, drive extents are allocated to RAID extents in the RAID Mapping Table 138, before and after Initial Group of Physical Drives 130 is split into multiple partnership groups, such that no two drive extents indicated by any single RAID extent are located on the same physical storage drive.

A drive extent may be released (i.e. deallocated) from a specific RAID extent back to Drive Extent Pool 134, and thereby made available for allocation to a different RAID extent, in response to a deallocation request or the like from RAID Group Mapping Logic 136, e.g. when the drive extent is no longer needed to store host data.

When a drive extent is allocated to a RAID extent, an indication of the drive extent is stored in the RAID extent. For example, a drive extent allocated to a RAID extent may be indicated within that RAID extent using a pair of indexes "m|n", in which "m" indicates a drive index of the physical data storage drive on which the drive extent is located (e.g. a numeric drive number within Array of Physical Non-Volatile Storage Drives 128, a slot number within which the physical drive located, or a textual drive name, etc.), and "n" indicates an index of the drive extent within the physical data storage drive (e.g. a numeric drive extent number, a block offset, a sector number, etc.). For example, in embodiments in which physical data storage drives are indexed within Array of Physical Non-Volatile Data Storage Devices 128 starting with 0, and in which drive extents are indexed within the physical data storage drive that contains them starting with 0, a first drive extent of a first physical data storage drive within Array of Physical Non-Volatile Data Storage Drives 128 may be represented by "0|0", a second drive extent within the first physical data storage drive within Array of Physical Non-Volatile Data Storage Drives 128 may be represented by "0||", and so on.

Host I/O Processing Logic 135 exposes one or more logical storage objects to Hosts 110 for reading and/or writing host data, so that Hosts 110 can issue Host I/O Operations 112 to specific storage objects, e.g. using names or other identifiers of the storage objects. The storage objects exposed to Host I/O Operations 112 may be written, read, created, and/or deleted by Hosts 110 through Host I/O Operations 112. The storage objects exposed to Hosts 110 may include or consist of logical disks sometimes referred to as "LUNs", such as LUN 144. The storage objects exposed to Hosts 110 may alternatively include or consist of a host file system, virtual volume, and/or some other type of storage object, which Host I/O Processing Logic 135 makes accessible to Hosts 110 for reading and/or writing host data.

Storage Object Mapping Logic 140 directs host data written to sets of consecutive blocks in a logical address space of LUN 144 to specific corresponding RAID extents in RAID Mapping Table 138, so that the host data written to a set of consecutive blocks in the logical address space can be persistently stored by drive extents indicated by the corresponding RAID extent, and so that parity information can be calculated and stored in at least one of the drive extents of the corresponding RAID extent to support data recovery. For example, an address space of LUN 144 may be made up of a set of sequential, equal size logical blocks of address space. Each host write I/O operation may indicate a specific block to be written within the address space of the LUN 144, e.g. using a logical block number (e.g. a logical block address) or offset into LUN 144. In some embodiments, 4D+1P RAID-5 block level striping with distributed parity error protection may be used, with each RAID stripe consisting of four data blocks and a block of parity information, and each RAID stripe being represented by a single RAID extent and mapped to drive extents indicated by that RAID extent. In such embodiments, each RAID extent may indicate five drive extents. For each set of four consecutive blocks in the logical address space of LUN 144 that are mapped to a single RAID extent, host data may be striped across the drive extents indicated by that RAID extent by storing host data written to consecutive ones of the four consecutive blocks of the logical address space into different ones of four of the drive extents indicated by that RAID extent. Parity information may be calculated and stored in a fifth drive extent indicated by the RAID extent, e.g. as an XOR of the host data stored in the other four drive extents indicated by the RAID extent. In this way, host data stored in any one of the four drive extents indicated by the RAID extent that store host data can be recovered in the event of a failure of a physical data storage drive containing one of the four drive extents indicated by the RAID extent that store host data, for example by performing one or more XOR operations on the data stored in the three surviving drive extents indicated by the RAID extent that store host data, in combination with the parity information stored in the fifth drive extent indicated by the RAID extent.

Further during operation, Drive Extent Pool Logic 132 detects the addition of a new physical storage drive, i.e. New Drive 125, to the Array of Physical Non-Volatile Data Storage Drives 128. For example, Drive Extent Pool Logic 132 may receive an indication that New Drive 125 has been inserted into Array of Physical Non-Volatile Data Storage Drives 128. In response to detecting that New Drive 125 has been added, Drive Extent Pool Logic 132 may pass an indication that New Drive 125 has been added to the Drive Addition Processing Logic 150, as shown by Drive Addition Notification 160. Drive Addition Notification 160 may include a total number of storage drives in the Initial Group of Physical Drives 130 that would result after the addition of New Drive 125 to the Initial Group of Physical Drives 130. For example, if prior to the addition of New Drive 125 to the Initial Group of Physical Drives 130, the Group of Physical Drives 130 had contained physical drives 0 through 7 for a previous total of 8 drives, then after the addition of New Drive 125 to Group of Physical Drives 130, the total number of storage drives in the Group of Physical Storage Drives 130 would be 9.

In response to receiving the Drive Addition Notification 160 from Drive Extent Pool Logic 132, Drive Addition Processing Logic 150 causes Group Size Comparison Logic 152 to compare the total number of physical data storage drives in the Initial Group of Physical Storage Drives 130, after the addition of New Drive 125, to a maximum drive group size. The maximum drive group size may, for example, be an integer configuration value that is set by a system administrator, or provided to Storage Processor 120 in some other way. The value the of maximum drive group size may, for example, be the output of or reflect performance tests performed on Data Storage System 116 and/or similar devices, under actual or simulated drive failure conditions, with different numbers of physical data storage devices contained in Initial Group of Physical Drives 130. For example, the value of the maximum drive group size may indicate a maximum number of physical data storage drives that may be contained in Initial Group of Physical Drives 130 before the level of concurrent processing available during the rebuild process becomes limited by the availability and/or performance of one or more resources in the data storage system other than the physical drives, e.g. by the availability and/or performance of Processing Circuitry 124, and/or the availability and/or performance of Memory 126, etc., such that using numbers of storage drives in Initial Group of Physical Drives 130 larger than the maximum drive group size fails to provide a significant improvement (i.e. significant or sufficient decrease) in the time required to perform a rebuild process following a failure of one of the physical data storage drives.

For purposes of explanation, the total number of storage drives in the Initial Group of Physical Storage Drives 130, after the addition of New Drive 125, would be 9, and the maximum drive group size is 8. Accordingly, Group Size Comparison Logic 152 detects that the total number of physical data storage drives in the Initial Group of Physical Storage Drives 130 after the addition of New Drive 125 would exceed the maximum drive group size.

In response to Group Size Comparison Logic 152 detecting that the total number of physical data storage drives in Initial Group of Physical Drives 130 would exceed the maximum drive group size if New Drive 125 were added to Initial Group of Physical Drives 130, Group Size Comparison Logic 152 sends a trigger (e.g. Trigger Drive Group Split 154) to Drive Group Splitting Logic 156, such as a message or other indication, that causes Drive Group Splitting Logic 156 to split the Group of Physical Drives 130 into multiple partnership groups, and to split RAID Mapping Table 138 into multiple RAID extent groups that each correspond to a respective one of the partnership groups, prior to adding New Drive 125 to one of the resulting multiple partnership groups.

Figure 2:
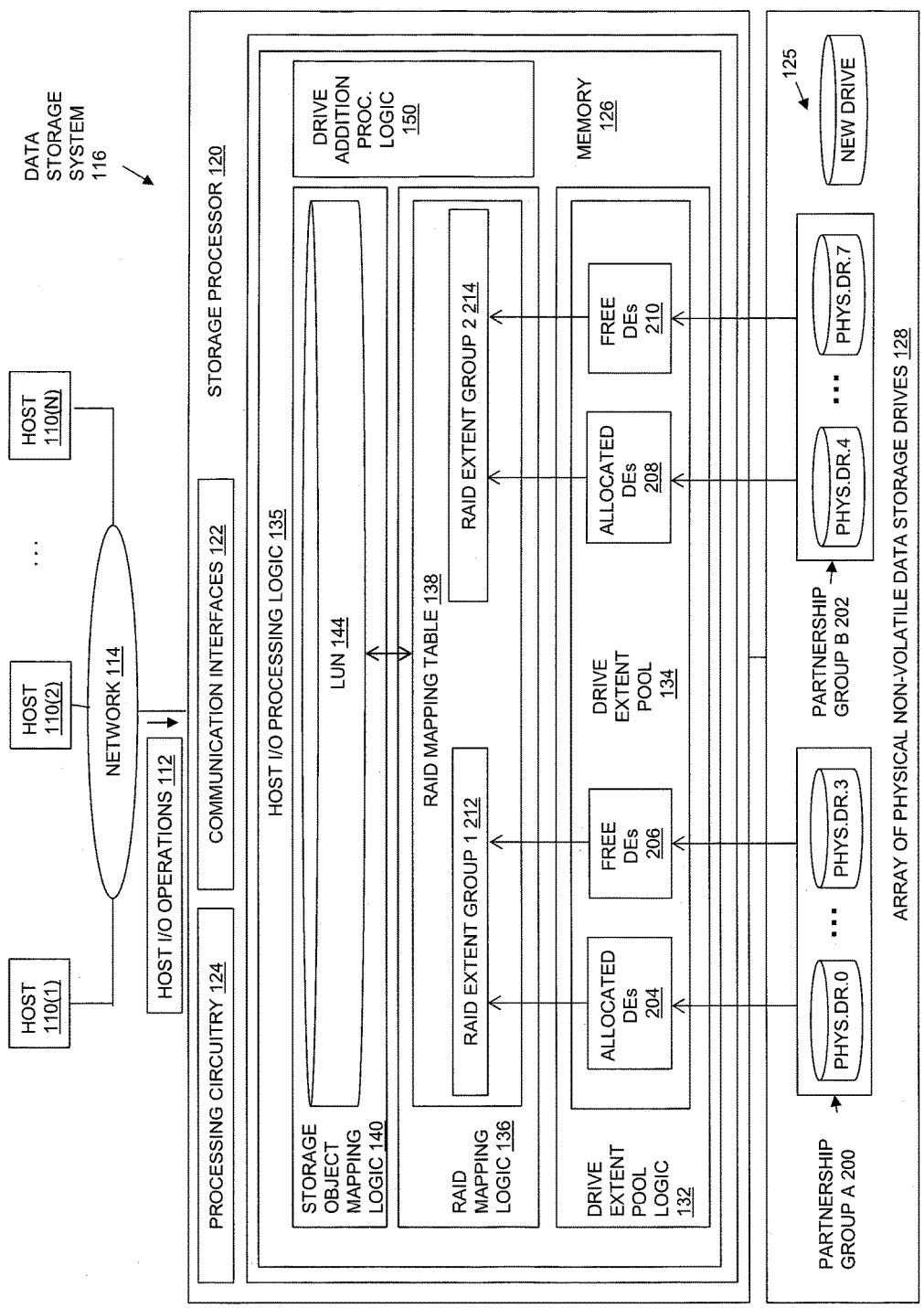
FIG. 2 is a block diagram showing another view of the operational environment of FIG. 1, showing an example in which the initial group of physical data storage drives shown in FIG. 1 is split into two partnership groups.

For example, as shown in FIG. 2, a trigger from Group Size Comparison Logic 152 that is issued to Drive Group Splitting Logic 156 in response to Group Size Comparison Logic 152 detecting that adding New Drive 125 would cause the total number of physical data storage drives in the Initial Group of Physical Drives 130 to exceed the maximum drive group size causes Drive Group Splitting Logic 156 to split the Group of Physical Drives 130 into a Partnership Group A 200 that is made up of physical data storage drives 0 through 3, and a Partnership Group B 202 that is made up of physical data storage drives 4 through 7, in which New Drive 125 from FIG. 1 is included in Partnership Group B 202 as physical data storage drive 7.

FIG. 2 further illustrates an example of operation of the disclosed system in which the Initial Group of Physical Drives 130 of FIG. 1 is split by Drive Group Splitting Logic 156 of FIG. 1 into a first partnership group and a second partnership group, shown by Partnership Group A 200 and Partnership Group B 202 respectively. As a result of the split, each physical data storage drive from the Group of Physical Drives 130 is contained in only one of the partnership groups, e.g. each of the physical data storage drives 0 through 7 is contained in only one of either Partnership Group A 200 or Partnership B 202. Further in the example of FIG. 2, each one of the partnership groups that are created by Drive Group Splitting Logic 156 both i) contains half of the physical data storage drives from Group of Physical Drives 130, and ii) contains a total number of physical data storage drives that is less than the maximum drive group size. In the example of FIG. 2, each one of Partnership Group A 200 and Partnership Group B 202 contains 4 physical drives, which is less than the example maximum drive group size of 8. New Drive 125 may then subsequently be added to either one of Partnership Group A 200 or Partnership Group B 202 without exceeding the maximum drive group size.

Drive Group Splitting Logic 156 may select the specific physical drives to be contained in Partnership Group A 200 and Partnership Group B 202 using any specific selection technique. For example, half of the physical data storage drives in Group of Physical Drives 130 having the lowest drive indexes may be selected for Partnership Group A 200, while half of the physical data storage drives in Group of Physical Drives 130 having the highest drive indexes may be selected for Partnership Group B 202. In an alternative approach, physical data storage drives having odd drive indices may be selected for one partnership group, while physical data storage drives having even drive indices may be selected for another, different partnership group. Any other specific selection technique may be used for selecting the specific physical data storage drives that are contained in specific ones of the partnership groups.

The trigger message 154 from Group Size Comparison Logic 152 that is issued to Drive Group Splitting Logic 156 in response to Group Size Comparison Logic 152 detecting that after the addition of New Drive 125 the total number of physical data storage drives in the Initial Group of Physical Drives 130 would exceed the maximum drive group size further causes Drive Group Splitting Logic 156 to assign the RAID extents in RAID Mapping Table 138 to multiple RAID extent groups, as for example shown in FIG. 2 by RAID Extent Group 1 212 and RAID Extent Group 2 214. Each one of RAID Extent Group 1 212 and RAID Extent Group 2 214 contains multiple RAID extents, and corresponds to one of the partnership groups of physical drives. For example, RAID Extent Group 1 212 corresponds to Partnership Group A 200, and RAID Extent Group 2 214 corresponds to Partnership Group B 202.

The RAID extents in each RAID extent group can only indicate drive extents that are located in physical data storage drives that are contained in the corresponding one of the partnership groups. Accordingly, RAID extents in RAID Extent Group 1 212 can only indicate drive extents in the Allocated Drive Extents 204, and all drive extents in Allocated Drive Extents 204 must be located on and allocated from physical drives contained in Partnership Group A 200. Similarly, RAID extents in RAID Extent Group 2 214 can only indicate drive extents in the Allocated Drive Extents 208, and all drive extents in Allocated Drive Extents 208 must be located on and allocated from physical drives contained in Partnership Group B 202.

Again with reference to FIG. 2, drive extents located in physical data storage drives that are contained in Partnership Group A 200 but are not allocated, i.e. that are not contained in Allocated Drive Extents 204, are shown by Free Drive Extents 206 and are available for allocation to RAID extents in RAID Extent Group 1 212. Similarly, those drive extents located in physical data storage drives that are contained in Partnership Group B 202 but are not allocated, i.e. that are not contained in Allocated Drive Extents 208, are shown by Free Drive Extents 210 and are available for allocation to RAID extents in RAID Extent Group 2 214.

The unallocated drive extents in Free Drive Extents 206 are available to be allocated, i) in response to detecting a failure of a physical data storage drive contained in Partnership Group A 200, to one or more RAID extents in the RAID Extent Group 1 212, to replace drive extents located in the failed physical data storage drive contained in Partnership Group A 200, and/or ii) as new drive extents that are used to replace previously allocated drive extents when modifying RAID extents in RAID Extent Group 1 212 to reflect the splitting of the Initial Group of Physical Drives 130 into multiple partnership groups. Similarly, the unallocated drive extents in Free Drive Extents 210 are available as spare drive extents to be allocated, i) in response to detecting a failure of a physical data storage drive contained in Partnership Group B 202, to one or more RAID extents in the RAID Extent Group 2 214, to replace drive extents located in the failed physical data storage drive contained in Partnership Group B 202, and/or ii) as new drive extents that are used to replace previously allocated drive extents when modifying RAID extents in RAID Extent Group 2 214 to reflect the splitting of the Initial Group of Physical Drives 130 into multiple partnership groups.

Drive Group Splitting Logic 156 divides the RAID extents in RAID Mapping Table 138 into RAID Extent Group 1 212 and RAID Extent Group 2 214 by first assigning each RAID extent in RAID Mapping Table 138 to one of either RAID Extent Group 1 212 or RAID Extent Group 2 214. In some embodiments, in response to Initial Group of Physical Drives 130 being split into Partnership Group A 200 and Partnership Group B 202, Drive Group Splitting Logic 156 may identify a subset of the RAID extents in RAID Mapping Table 136 that consists of a number of RAID extents that each indicate a higher total number of drive extents located on the physical data storage devices contained in Partnership Group A 200 than any RAID extent in RAID Mapping Table 138 that is not contained in the subset. Drive Group Splitting Logic 156 may then create RAID Extent Group 1 212 corresponding to Partnership Group A 200 by assigning the RAID extents contained in that subset of RAID extents in RAID Mapping Table 138 to RAID Extent Group 1 212. Drive Group Splitting Logic 156 may then create RAID Extent Group 2 214 corresponding to Partnership Group B 202 by assigning all other RAID extents in RAID Mapping Table 136, i.e. all RAID extents other than the RAID extents contained in the subset of RAID extents, to RAID Extent Group 2 214.

In some embodiments, Drive Group Splitting Logic 156 identifies the subset of the RAID extents in RAID Mapping Table 138 that consists of the RAID extents in RAID Mapping Table 138 that each indicate a higher total number of drive extents located in the physical data storage drives contained in Partnership Group A 200 than any RAID extent in the RAID Mapping Table 138 that is not included in the subset by i) calculating a total capacity of Partnership Group A 200 that is equal to the total number of disk extents allocated from Partnership Group A 200 to all RAID extents in the RAID Mapping Table 138, ii) calculating a total number of RAID extents to be assigned to RAID Extent Group 1 212 that is equal to the total capacity of Partnership Group A 200 divided by the number of drive extents indicated by each RAID extent, iii) generating, for each RAID extent in RAID Mapping Table 138, a corresponding first partnership group drive extent count equal to a total number of drive extents indicated by the RAID extent that are contained in Partnership Group A 200, iv) generating a Sorted List of RAID Extents 157 (FIG. 1) by sorting the RAID extents in RAID Mapping Table 138 in descending order of corresponding first partnership group drive extent count, and v) selecting a number of RAID extents that are located at the top of the Sorted List of RAID Extents 157 that is equal to the total number of RAID extents to be assigned to the first RAID Extent Group 1 212.

In some embodiments, dividing the RAID extents in RAID Mapping Table 138 by Drive Group Splitting Logic 156 into RAID Extent Group 1 212 and RAID Extent Group 2 214 includes, after each RAID extent in RAID Mapping Table 138 has been assigned to one of either RAID Extent Group 1 212 or RAID Extent Group 2 214, identifying at least one RAID extent that indicates at least one drive extent that is located in a physical data storage drive that is contained in a partnership group other than the partnership group that corresponds to the RAID extent group to which that RAID extent is assigned. For example, Drive Group Splitting Logic 156 may identify a RAID extent in RAID Extent Group 1 212 that indicates a drive extent that is located in a physical data storage drive that is contained in Partnership Group B 202. Similarly, Drive Group Splitting Logic 156 may identify a RAID extent in RAID Extent Group 2 214 that indicates a drive extent that is located in a physical data storage drive that is contained in Partnership Group A 200.

After at least one RAID extent has been identified that indicates at least one drive extent that is located in a physical data storage drive that is contained in a partnership group other than the partnership group that corresponds to the RAID extent group to which that RAID extent is assigned, Drive Group Splitting Logic 156 may modify each RAID extent that indicates at least one drive extent that is located in a physical data storage drive that is contained in a partnership group other than the partnership group that corresponds to the RAID extent group to which that RAID extent is assigned to indicate only drive extents that are located in physical data storage drives that are contained in the partnership group that corresponds to the RAID extent group to which that RAID extent is assigned.

For example, in the case of a RAID extent in RAID Extent Group 1 212 that indicates a drive extent that is located in a physical data storage drive that is contained in Partnership Group B 202, Drive Group Splitting Logic 156 may allocate a new drive extent from Partnership Group A 200, and, for that RAID extent, replace the drive extent located in a physical data storage drive contained in Partnership Group B 202 with the new drive extent allocated from Partnership Group A 200. Replacing the drive extent located in the physical data storage drive contained in Partnership Group B 202 with the new drive extent allocated from Partnership Group A 200 may include replacing, in the RAID extent, an indication of the drive extent located in the physical data storage drive contained in Partnership Group B 202 with an indication of the new drive extent allocated from Partnership Group A 200, and copying host data previously stored on the drive extent located in the physical data storage drive contained in Partnership Group B 202 to the new drive extent allocated from Partnership Group A 200.

In another example, in the case of a RAID extent in RAID Extent Group 2 214 that indicates a drive extent that is located in a physical data storage drive that is contained in Partnership Group A 200, Drive Group Splitting Logic 156 may allocate a new drive extent from Partnership Group B 202, and, for that RAID extent, replace the drive extent located in the physical data storage drive contained in Partnership Group A 200 with the new drive extent allocated from Partnership Group B 202. Replacing the drive extent located in the physical data storage drive contained in Partnership Group A 200 with the new drive extent allocated from Partnership Group B 202 may include replacing, in the RAID extent, an indication of the drive extent located in the physical data storage drive contained in Partnership Group A 200 with an indication of the new drive extent allocated from Partnership Group B 202, and copying host data previously stored on the drive extent located in the physical data storage drive contained in Partnership Group A 200 to the new drive extent allocated from Partnership Group B 202.

In some embodiments, Drive Group Splitting Logic 156 modifies at least one drive extent indication in at least one of the RAID extents in RAID Mapping Table 138 to reflect the splitting of Initial Group of Physical Data Storage Drives 130 into Partnership Group A 200 and Partnership Group B 202 by first selecting, from among Partnership Group A 200 and Partnership Group B 202, a destination partnership group and a source partnership group. For example, Drive Group Splitting Logic 156 may select a destination partnership group and a source partnership group by i) comparing a total number of free drive extents in Partnership Group A 200 to a total number of free drive extents in Partnership Group B 202, ii) selecting the one of Partnership Group A 200 and Partnership Group B 202 that has a larger total number of free drive extents as the destination partnership group, and iii) selecting the one of Partnership Group A 200 and Partnership Group B 202 that has a smaller total number of free drive extents as the source partnership group. Drive Group Splitting Logic 156 may then identify a drive extent to be released that is located on one of the physical data storage drives contained in the source partnership group and that is allocated to a RAID extent in the RAID extent group corresponding to the destination partnership group. Drive Group Splitting Logic 156 may then allocate a new drive extent from the free drive extents in the destination partnership group to the RAID extent in the RAID extent group corresponding to the destination partnership group, to which the drive extent to be released is allocated. The data stored on the drive extent to be released may then be copied to the new drive extent, and the RAID extent in the RAID extent group corresponding to the destination partnership group may be modified to indicate the new drive extent instead of the drive extent to be released. The drive extent to be released may then be released to the free drive extents of the source partnership group.

In some embodiments, Drive Group Splitting Logic 156 may allocate the new drive extent from the free drive extents in the destination partnership group by first generating a neighborhood matrix for the destination partnership group. For example, in the case where the destination partnership group is Partnership Group A 200, Drive Group Splitting Logic 156 may have previously generated Neighborhood Matrix A 159 (FIG. 1). In the case where the destination partnership group is Partnership Group B 202, Drive Group Splitting Logic 156 may have previously generated Neighborhood Matrix B 161. Each element in the neighborhood matrix for the destination partnership group corresponds to a pair of physical data storage drives contained in the destination partnership group, and stores a value equal to a total number of RAID extents in the RAID extent group corresponding to the destination partnership group that indicate both i) at least one drive extent located on a first one of the drives in the pair of drives corresponding to the element, and ii) at least one drive extent located on a second one of the drives in the pair of drives corresponding to the element. Drive Group Splitting Logic 156 may then generate a list of candidate drives that are contained in the destination partnership group, where each one of the candidate drives has located thereon at least one free drive extent. Drive Group Splitting Logic 156 may then assign, to each one of the candidate drives in the list of candidate drives, a variance weighting that is equal to a variance of the values of the elements in the neighborhood matrix for the destination partnership group that would result from modifying the neighborhood matrix to indicate that the new drive extent was allocated from the candidate drive. Drive Group Splitting Logic 156 may then select the one of the candidate drives that has the lowest assigned variance weighting, and allocate the new drive extent from the candidate drive having the lowest assigned variance weighting.

Each RAID extent in the RAID Mapping Table 138 indicates the same number of drive extents. For example, in some embodiments configured to provide 4D+1P RAID-5 protection for LUN 144, each RAID extent in the RAID Mapping Table 138 may represent a single data stripe by indicating five drive extents, where each of the five drive extents is located on a different physical data storage drive, and where four of the drive extents are used to store host data written to LUN 144 and one of the drive extents is used to store parity information. In order to provide drive diversity with regard to spare drive extents, the minimum number of physical drives (e.g. in Initial Group of Physical Drives 130, Partnership Group A 200, and/or Partnership Group B 202), that is required to provide 4D+1P RAID-5 protection for LUN 144 must be greater than five, i.e. six or more. In another example, in some embodiments configured to provide 4D+2P RAID-6 protection for LUN 144, each RAID extent in the RAID Mapping Table 138 may represent a single data stripe by indicating six drive extents, where each of the six drive extents is located on a different physical data storage drive, and where four of the drive extents are used to store host data written to LUN 144 and two of the drive extents are used to store parity information. In order to provide drive diversity with regard to providing spare drive extents, the minimum number of physical data storage drives (e.g. in Initial Group of Physical Drives 130, Partnership Group A 200, and/or Partnership Group B 202), that is required to provide 4D+2P RAID-6 protection for LUN 144 must be greater than six, i.e. seven or more. In either of these examples, the minimum number of physical drives required to provide RAID data protection for LUN 144 may be greater than the number of drive extents indicated by each RAID extent in the RAID Mapping Table 138. In some embodiments, the maximum drive group size may be at least twice as large as the minimum number of physical storage drives required to provide RAID data protection for LUN 144.

Figure 3:
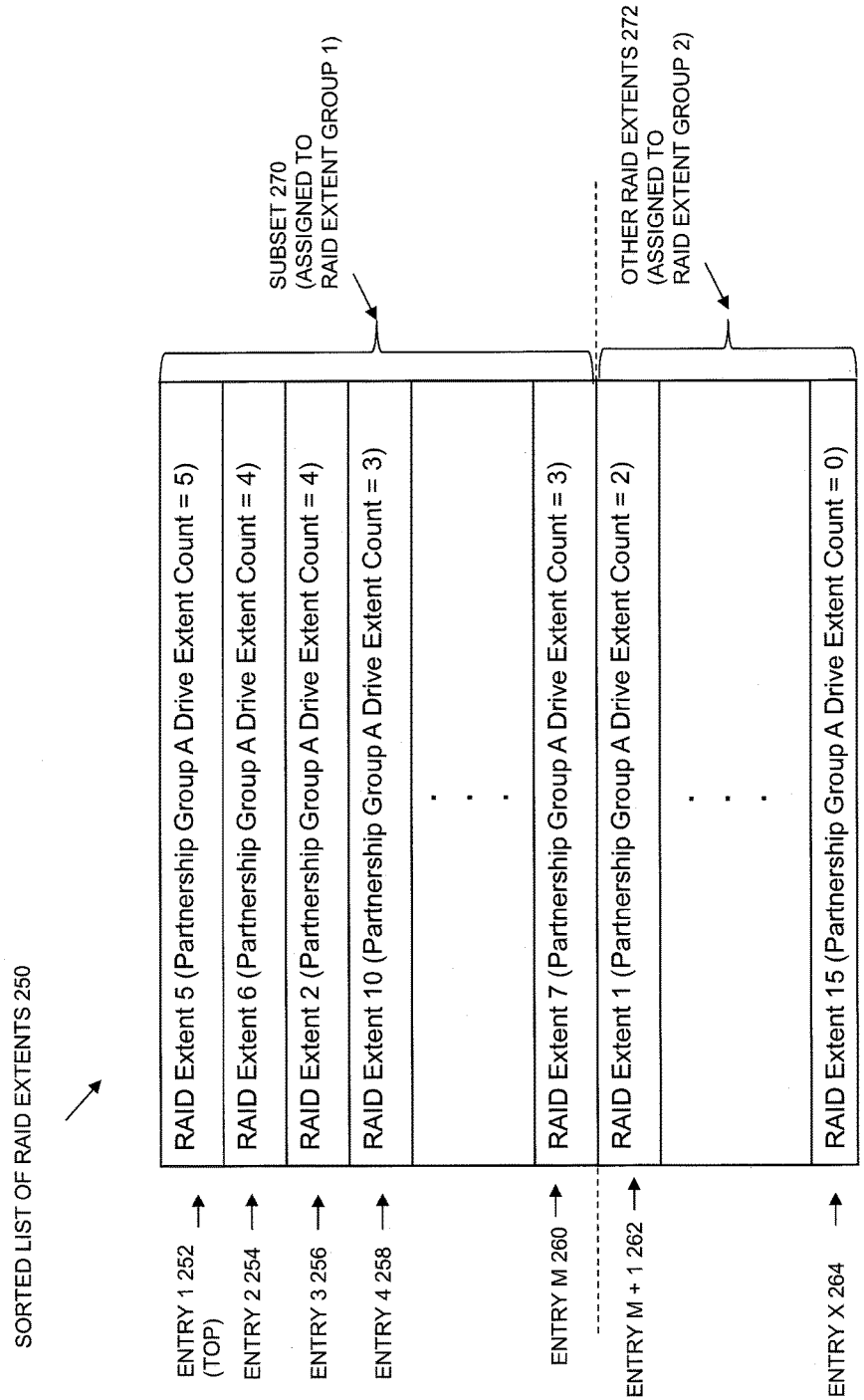
FIG. 3 is a block diagram showing an example of a sorted list of RAID extents generated in some embodiments to assign RAID extents to different RAID extent groups in response to the splitting of an initial group of physical data storage drives into two partnership groups.

FIG. 3 is a block diagram showing an example of a Sorted List of RAID Extents 250 generated in some embodiments to assign RAID extents to different RAID extent groups in response to detecting that an initial group of physical data storage drives has been split into two partnership groups. The Sorted List of RAID Extents 250 is an example of the Sorted List of RAID Extents 157 shown in FIG. 1, and may be generated by Drive Group Splitting Logic 156 by sorting the RAID extents in RAID Mapping Table 138 in descending order of corresponding partnership group drive extent count. For example, the partnership group drive extent count for each RAID extent may be equal to the number of drive extents indicated by that RAID extent that are located on physical data storage drives contained in a first one of the two partnership groups, e.g. in Partnership Group A 200. Entry 1 252 at the top of Sorted List of RAID Extents 250 contains RAID extent 5, which has a partnership group drive extent count for Partnership Group A 200 of 5, meaning that RAID extent 5 in RAID Mapping Table 138 (e.g. the fifth RAID extent in RAID Mapping Table 138) indicates 5 drive extents that are located on physical data storage drives contained in Partnership Group A 200. Entry 2 254 contains RAID extent 6, which has a partnership group drive extent count for Partnership Group A 200 of 4, meaning that RAID extent 6 in RAID Mapping Table 138 indicates 4 drive extents that are located on physical data storage drives contained in Partnership Group A 200. Entry 3 256 contains RAID extent 2, which has a partnership group drive extent count for Partnership Group A 200 of 4, meaning that RAID extent 2 in RAID Mapping Table 138 indicates 4 drive extents that are located on physical data storage drives contained in Partnership Group A 200. Entry 4 258 contains RAID extent 10, which has a partnership group drive extent count for Partnership Group A 200 of 3, meaning that RAID extent 10 in RAID Mapping Table 138 indicates 3 drive extents that are located on physical data storage drives contained in Partnership Group A 200. The entries in Sorted List of RAID Extents 250 continue in descending order of partnership group drive extent count for Partnership Group A 200 through Entry M 260, which has a partnership group drive extent count for Partnership Group A 200 of 3, meaning that RAID extent 7 in RAID Mapping Table 138 indicates 3 drive extents that are located on physical data storage drives contained in Partnership Group A 200. The entries from Entry 1 252 through Entry M 260 make up a Subset 270 of entries that are located at the top of the Sorted List of RAID Extents 250. The number of entries in Subset 270 is "M", where "M" is equal to a total number of RAID extents to be assigned to the RAID Extent Group 1 212, which corresponds to Partnership Group A 200. The Subset 270 is accordingly assigned to RAID Extent Group 1 212. Other RAID Extents 272 includes all RAID extents in RAID Mapping Table 138 other than the RAID entries contained in Subset 270, e.g. Entry M+1 262 indicating RAID extent 1, which has a partnership group drive extent count for Partnership Group A 200 of 2, meaning that RAID extent 1 in RAID Mapping Table 138 indicates 2 drive extents that are located on physical data storage drives contained in Partnership Group A 200, through Entry X 264 indicating RAID Extent 15, which has a partnership group drive extent count for Partnership Group A 200 of 0, meaning that RAID extent 15 in RAID Mapping Table 138 indicates 0 drive extents that are located on physical data storage drives contained in Partnership Group A 200. Other RAID Extents 272 are accordingly assigned to RAID Extent Group 2 214.

Figure 4:
FIG. 4 is a block diagram showing an example of a partnership group neighborhood matrix generated in some embodiments.

FIG. 4 is a block diagram showing an example of a Partnership Group Neighborhood Matrix 300 ("NM") generated by Drive Group Splitting Logic 156 in some embodiments. Partnership Group Neighborhood Matrix 300 is an example of the structure of Neighborhood Matrix A 159 and/or Neighborhood Matrix B 161 in FIG. 1. Each element in Partnership Group Neighborhood Matrix 300 may be designated by NM(i,j), where i indicates a first one of the physical data storage drives in a corresponding partnership group, and j indicates a second one of the physical data storage drives in the corresponding partnership group. For example, Partnership Group Neighborhood Matrix 300 may correspond to a destination partnership group, and each element in Partnership Group Neighborhood Matrix 300 may correspond to a pair of physical data storage drives contained in that destination partnership group, and store a value equal to a total number of RAID extents in the RAID extent group corresponding to the destination partnership group that indicate both i) at least one drive extent located on a first one of the drives in the pair of drives corresponding to the element, and ii) at least one drive extent located on a second one of the drives in the pair of drives corresponding to the element.

In an operational example in which Partnership Group A 200 is selected as the destination partnership group (see step 404 in FIG. 5), Partnership Group Neighborhood Matrix 300 may be an illustrative example of Neighborhood Matrix A 159. In such an operational example, the value of each element NM(i,j) in Neighborhood Matrix 300 is equal to the total number of RAID extents in RAID Extent Group 1 212 that indicate both at least one drive extent located on a physical data storage drive i contained within Partnership Group A 200 and at least one drive extent located on a physical data storage drive j contained within Partnership Group A 200, where i and j vary between 0 and 3, since the physical data storage drives in Partnership Group A 200 are physical data storage drives numbered 0 through 3. In this way, each element in NM(i,j) indicates how many times physical data storage drive i is a "neighbor" to physical data storage drive j within a RAID extent. It should be recognized that the Partnership Group Neighborhood Matrix 300 is a symmetric matrix, in that the value of NM(i,j) is equal to the value of NM(j,i), and that the diagonal elements in which i equals j have a value of 0, since a physical data storage drive cannot be a neighbor to itself, and may be set to zero. The values of NM(0,0), NM(1,1), NM(2,2), and NM(3,3) are accordingly zero.

Further in the operational example in which Partnership Group A 200 is selected as the destination partnership group, the value of NM(1,0) (and the value of NM(0,1)) is equal to the total number of RAID extents in RAID Extent Group 1 212 that indicate both at least one drive extent located on physical data storage drive 1 and at least one drive extent located on physical data storage drive 0. The value of NM(2,0) (and the value of NM(0,2)) is equal to the total number of RAID extents in RAID Extent Group 1 212 that indicate both at least one drive extent located on physical data storage drive 2 and at least one drive extent located on physical data storage drive 0. The value of NM(3,0) (and the value of NM(0,3)) is equal to the total number of RAID extents in RAID Extent Group 1 212 that indicate both at least one drive extent located on physical data storage drive 3 and at least one drive extent located on physical data storage drive 0. The value of NM(2,1) (and the value of NM(1,2)) is equal to the total number of RAID extents in RAID Extent Group 1 212 that indicate both at least one drive extent located on physical data storage drive 2 and at least one drive extent located on physical data storage drive 1. The value of NM(3,1) (and the value of NM(1,3)) is equal to the total number of RAID extents in RAID Extent Group 1 212 that indicate both at least one drive extent located on physical data storage drive 3 and at least one drive extent located on physical data storage drive 1. The value of NM(3,2) (and the value of NM(2,3)) is equal to the total number of RAID extents in RAID Extent Group 1 212 that indicate both at least one drive extent located on physical data storage drive 3 and at least one drive extent located on physical data storage drive 2.

While in the above operational example Partnership Group A 200 is selected as the destination partnership group, those skilled in the art will recognize that Partnership Group Neighborhood Matrix 300 may also illustrate the structure Neighborhood Matrix B 161, e.g. in an operational example in which Partnership Group B 202 is selected as the destination partnership group, albeit with regard to indicating "neighbor" relations among physical data storage drives 4 through 7 instead of among physical data storage drives 0 through 3.

Figure 5:
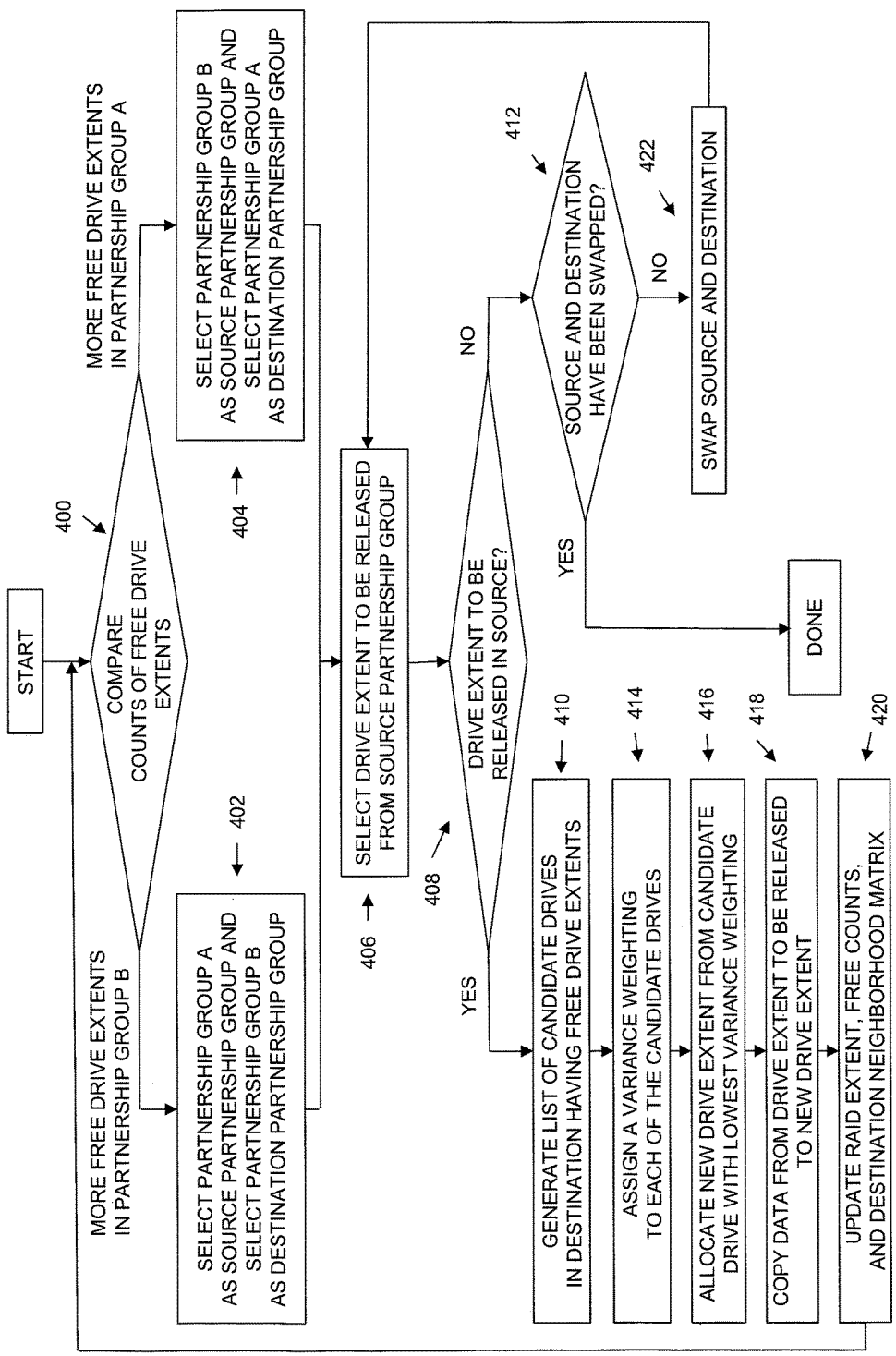
FIG. 5 is a flow chart showing steps performed in some embodiments to modify at least one drive extent indication in at least one RAID extent to reflect the splitting of an initial group of physical data storage drives into a first partnership group and a second partnership group.

FIG. 5 is a flow chart showing steps performed in some embodiments to modify at least one drive extent indication in at least one RAID extent to reflect the splitting of an initial group of physical data storage drives into a first partnership group and a second partnership group. The steps of FIG. 5 may, for example, be performed by the Drive Group Splitting Logic 156 shown in FIG. 1. At 400, the number of free (i.e. unallocated) drive extents in Partnership Group A 200 is compared to the number of free drive extents in Partnership Group B 202. In response to detecting that the number of free drive extents in Partnership Group A 200 exceeds the number of free drive extents in Partnership Group B 202, step 400 is followed by step 404, in which Partnership Group B 202 is selected as the source partnership group, and Partnership Group A 200 is selected as the destination partnership group. Alternatively, in response to detecting that the number of free drive extents in Partnership Group B 202 exceeds the number of free drive extents in Partnership Group A 200, step 400 is followed by step 402, in which Partnership Group A 200 is selected as the source partnership group, and Partnership Group B 202 is selected as the destination partnership group. Both step 402 and step 404 are followed by step 406.

In step 406, a drive extent to be released is selected from the source partnership group. The drive extent to be released is a drive extent located on a physical data storage drive contained in the source partnership group, and that is indicated by a RAID extent assigned to the RAID extent group corresponding to the destination partnership group. If at step 408 a determination is made that there is no drive extent to be released in the source partnership group, i.e. that all drive extents located on the physical data storage drives contained in the source partnership group are indicated by RAID extents assigned to the RAID extent group corresponding to the source partnership group, then step 408 is followed by step 412, in which a determination is made as to whether the source partnership group and destination partnership group were previously swapped at step 422. If the source partnership group and the destination partnership group were previously swapped at step 422 in a preceding iteration of the steps shown in FIG. 5, then there are no further drive extents to be released in either the source partnership group or the destination partnership group, and the process of modifying RAID extents in response to the splitting of the initial physical storage drive group into the two partnership groups is complete.

Otherwise, if at step 412 it is determined that the source partnership group and the destination partnership group were not previously swapped at step 422, then step 412 is followed by step 422, in which the destination partnership group is selected a new source partnership group, and the source partnership group is selected as a new destination partnership group. Step 422 is followed by step 406.

If at step 408 a determination is made that there is a drive extent to be released in the source partnership group, then step 408 is followed by step 410. At step 410, a list of candidate drives is generated. The list of candidate drives consists of those physical data storage drives in the destination partnership group that each have located on them at least one free drive extent. At step 414, a variance weighting is assigned to each candidate drive in the list of candidate drives. The variance weighting for a given one of the candidate drives is calculated as the variance of the values in the neighborhood matrix corresponding to the destination partnership group, as modified to reflect an allocation of a new drive extent from that candidate drive to replace the drive extent to be released. For example, in an operational example in which Partnership Group A 200 is selected as the destination partnership group, and physical data storage drives 0 and 1 each have located thereon at least one free drive extent, the candidate list would include physical data storage drives 0 and 1. The variance weighting for physical data storage drive 0 would be equal to the variance of the values of the elements in Neighborhood Matrix A 159, albeit modified to reflect replacement of the drive extent to be released in RAID Extent Group 1 212 by a new drive extent allocated from physical data storage drive 0. Similarly, the variance weighting for physical data storage drive 1 would be equal to the variance of the values of the elements in Neighborhood Matrix A 159, albeit alternatively modified to reflect replacement of the drive extent to be released in RAID Extent Group 1 212 by a new drive extent allocated from physical data storage drive 1.

The variance of the elements in the neighborhood matrix corresponding to the destination partnership group may be calculated using conventional techniques for calculating a variance. For example, for a neighborhood matrix corresponding to a destination partnership group that has N+1 physical data storage drives, variance across the values of the neighborhood matrix may be calculated as follows:

$$\overline{NM} = \left(\sum_{\substack{i=0 \\ j=0}}^{N} NM(i, j)\right) / N^2$$

$$\text{variance} = \left(\sum_{\substack{i=0 \\ j=0}}^{N} (NM(i, j) - \overline{NM})^2\right) / N^2$$

At step 416 a new drive extent is allocated from the physical data storage drive in the candidate list having the lowest variance weighting. At step 418 the data from the drive extent to be released is copied to the new drive extent. At step 420, the indication of the drive extent to be released is changed to an indication of the new drive extent in the RAID extent in the RAID extent group corresponding to the destination partnership group that previously indicated the drive extent to be released. Further at step 420, the free drive extent count for the destination partnership group is decremented, and the free drive extent count for the source partnership group is incremented. The neighborhood matrix for the destination partnership group is also modified to reflect the change of the indication of the drive extent to be released to the indication of the new drive extent in the RAID extent in the RAID extent group corresponding to the destination partnership group that previously indicated the drive extent to be released.

Figure 6:
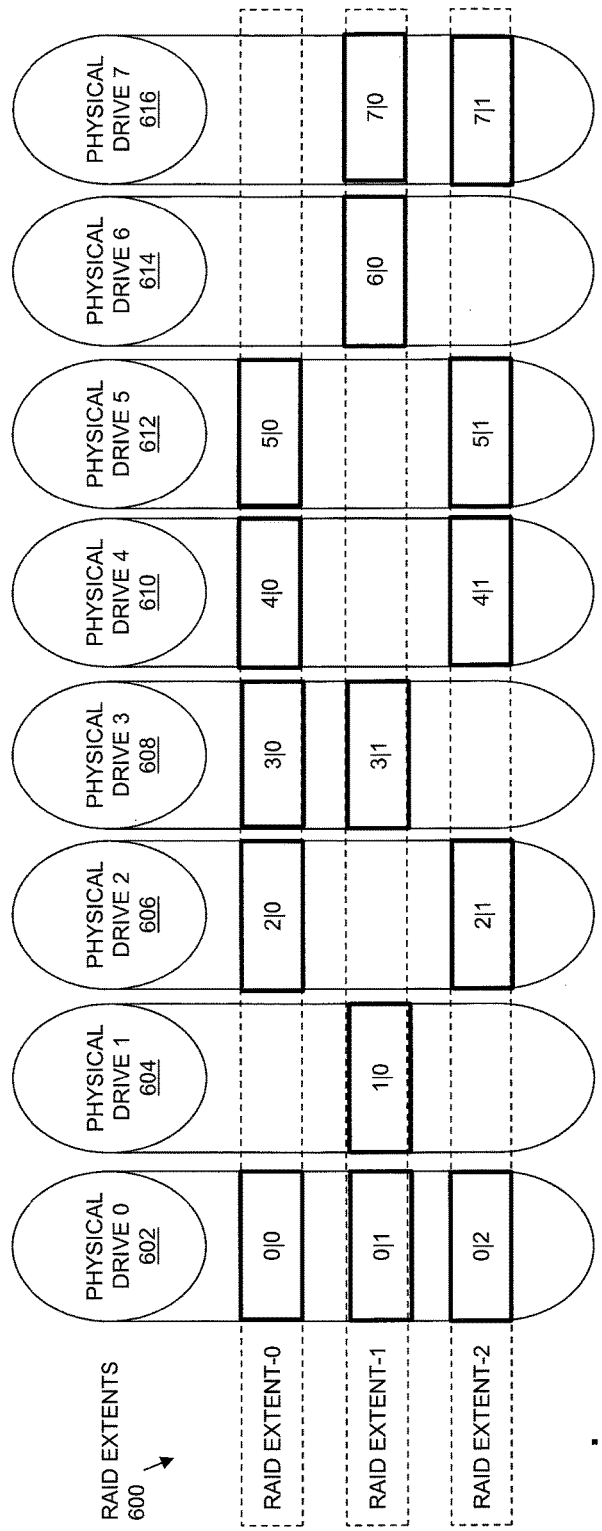
FIG. 6 is a block diagram showing an example of RAID extents.

FIG. 6 is a block diagram showing an illustrative example of RAID Extents 600, as may be contained in the RAID Mapping Table 138 in embodiments that provide 4D+1P RAID-5 striping and data protection. As shown in the example of FIG. 3, RAID Extents 600 include a first RAID Extent-1, a second RAID Extent-2, a third RAID Extent-3, and so on for some total number of RAID extents. In order to provide 4D+1P RAID-5, each RAID extent in RAID Extents 600 indicates five drive extents.

RAID Extent-1 indicates a first drive extent 0|0, which is the first drive extent in Physical Drive 0 602, a second drive extent 2|0, which is the first drive extent in Physical Drive 2 606, a third drive extent 3|0, which is the first drive extent in Physical Drive 3 608, a fourth drive extent 4|0, which is the first drive extent in Physical Drive 4 610, and a fifth drive extent 5|0, which is the first drive extent in Physical Drive 5 612.

RAID Extent-2 indicates a first drive extent 0|1, which is the second drive extent in Physical Drive 0 602, a second drive extent 1|0, which is the first drive extent in Physical Drive 1 604, a third drive extent 3|1, which is the second drive extent in Physical Drive 3 608, a fourth drive extent 6|0, which is the first drive extent in Physical Drive 6 614, and a fifth drive extent 7|0, which is the first drive extent in Physical Drive 7 616.

RAID Extent-3 indicates a first drive extent 0|2, which is the third drive extent in Physical Drive 0 602, a second drive extent 2|1, which is the second drive extent in Physical Drive 2 606, a third drive extent 4|1, which is the second drive extent in Physical Drive 4 610, a fourth drive extent 5|1, which is the second drive extent in Physical Drive 5 612, and a fifth drive extent 7|1, which is the second drive extent in Physical Drive 7 616.

In one example of operation, Physical Drive 0 602 through Physical Drive 7 616 may be part of a larger group of physical data storage drives that is split into two partnership groups, with a first resulting partnership group made up of a set of at least six physical data storage drives that includes Physical Drive 0 602 through Physical Drive 3 608, and a second resulting partnership group made up of a set of at least six physical data storage drives that includes Physical Drive 4 610 through Physical Drive 7 616. For example, RAID Extent-0 and RAID Extent-1 may be assigned to a first RAID extent group corresponding to the first partnership group, and RAID Extent-2 may be assigned to a second RAID extent group corresponding to the second partnership group.

Since the fourth drive extent and the fifth drive extent indicated by RAID Extent-0 are located in physical data storage drives that are contained in the second partnership group, RAID Extent-0 would be modified so that the fourth drive extent and the fifth drive extent indicated by RAID Extent-0 are instead located in the physical data storage drives contained in the first partnership group.

Since the fourth drive extent and the fifth drive extent indicated by RAID Extent-1 are also located in physical data storage drives that are contained in the second partnership group, RAID Extent-1 would also be modified so that the fourth drive extent and the fifth drive extent indicated by RAID Extent-1 are instead located in the physical data storage drives contained in the first partnership group.

Since the first drive extent and the second drive extent indicated by RAID Extent-2 are located in physical data storage drives that are contained in the first partnership group, RAID Extent-2 would be modified so that the first drive extent and the second drive extent indicated by RAID Extent-2 are instead located in the physical data storage drives contained in the second partnership group.

Figure 7:
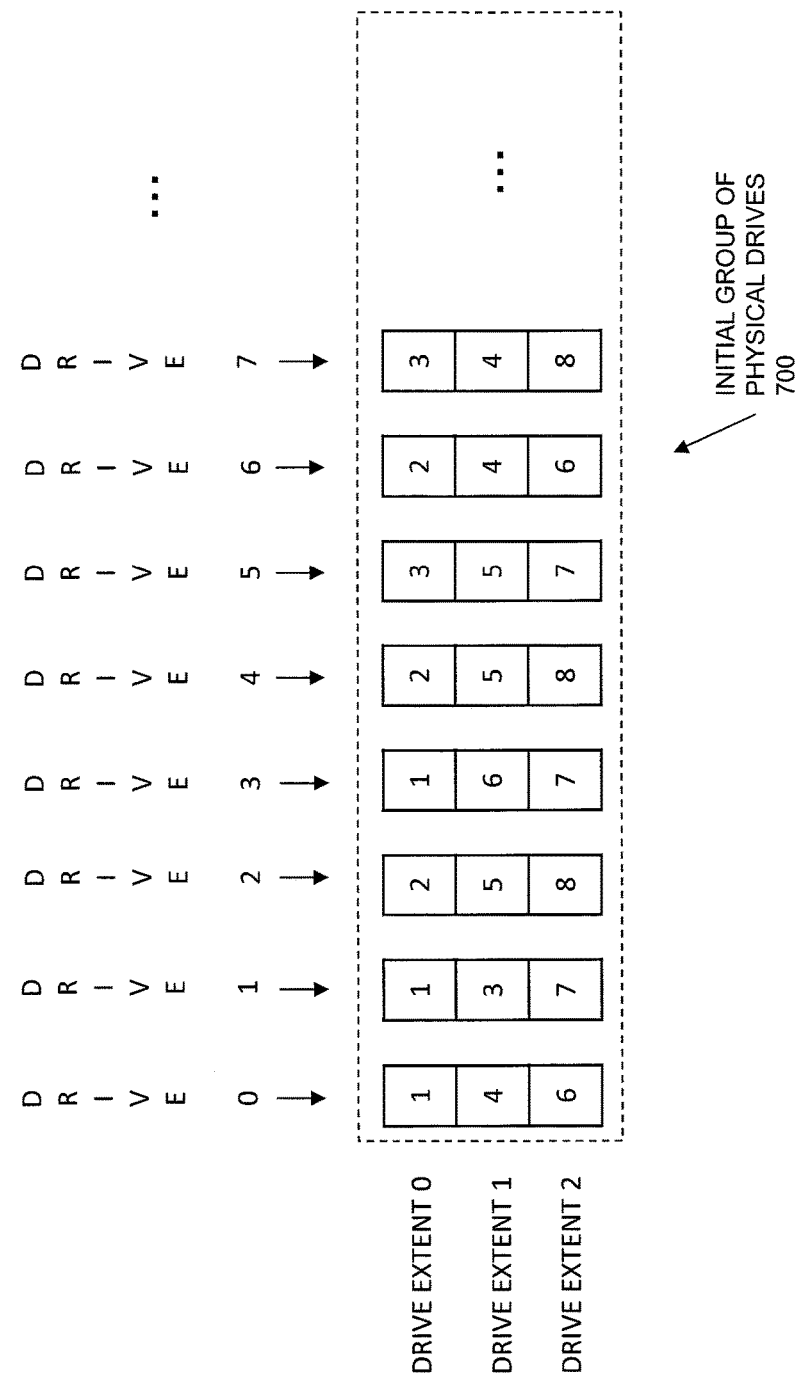
FIG. 7 is a block diagram showing an example of an initial group of physical data storage drives, and indicates the indices of the RAID extents in the RAID mapping table to which individual drive extents of the physical data storage drives are allocated.

FIG. 7 is a block diagram showing an example of some of the physical data storage drives within an Initial Group of Physical Drives 700, with indications of the indices of the RAID extents in the RAID mapping table to which each individual drive extent is allocated. As shown in the block diagram of FIG. 7, Drive Extent 0 of Physical Data Storage Drive 0 is allocated to RAID extent 1, Drive Extent 1 of Physical Data Storage Drive 0 is allocated to RAID extent 4, Drive Extent 2 of Physical Data Storage Drive 0 is allocated to RAID extent 6, Drive Extent 0 of Physical Data Storage Drive 1 is allocated to RAID extent 1, Drive Extent 1 of Physical Data Storage Drive 1 is allocated to RAID extent 3, Drive Extent 2 of Physical Data Storage Drive 1 is allocated to RAID extent 7, Drive Extent 0 of Physical Data Storage Drive 2 is allocated to RAID extent 2, Drive Extent 1 of Physical Data Storage Drive 2 is allocated to RAID extent 5, Drive Extent 2 of Physical Data Storage Drive 2 is allocated to RAID extent 8, Drive Extent 0 of Physical Data Storage Drive 3 is allocated to RAID extent 1, Drive Extent 1 of Physical Data Storage Drive 3 is allocated to RAID extent 6, Drive Extent 2 of Physical Data Storage Drive 3 is allocated to RAID extent 7, Drive Extent 0 of Physical Data Storage Drive 4 is allocated to RAID extent 2, Drive Extent 1 of Physical Data Storage Drive 4 is allocated to RAID extent 5, Drive Extent 2 of Physical Data Storage Drive 4 is allocated to RAID extent 8, Drive Extent 0 of Physical Data Storage Drive 5 is allocated to RAID extent 3, Drive Extent 1 of Physical Data Storage Drive 5 is allocated to RAID extent 5, Drive Extent 2 of Physical Data Storage Drive 5 is allocated to RAID extent 7, Drive Extent 0 of Physical Data Storage Drive 6 is allocated to RAID extent 2, Drive Extent 1 of Physical Data Storage Drive 6 is allocated to RAID extent 4, Drive Extent 2 of Physical Data Storage Drive 6 is allocated to RAID extent 6, Drive Extent 0 of Physical Data Storage Drive 7 is allocated to RAID extent 3, Drive Extent 1 of Physical Data Storage Drive 7 is allocated to RAID extent 4, and Drive Extent 2 of Physical Data Storage Drive 7 is allocated to RAID extent 8.

Figure 8:
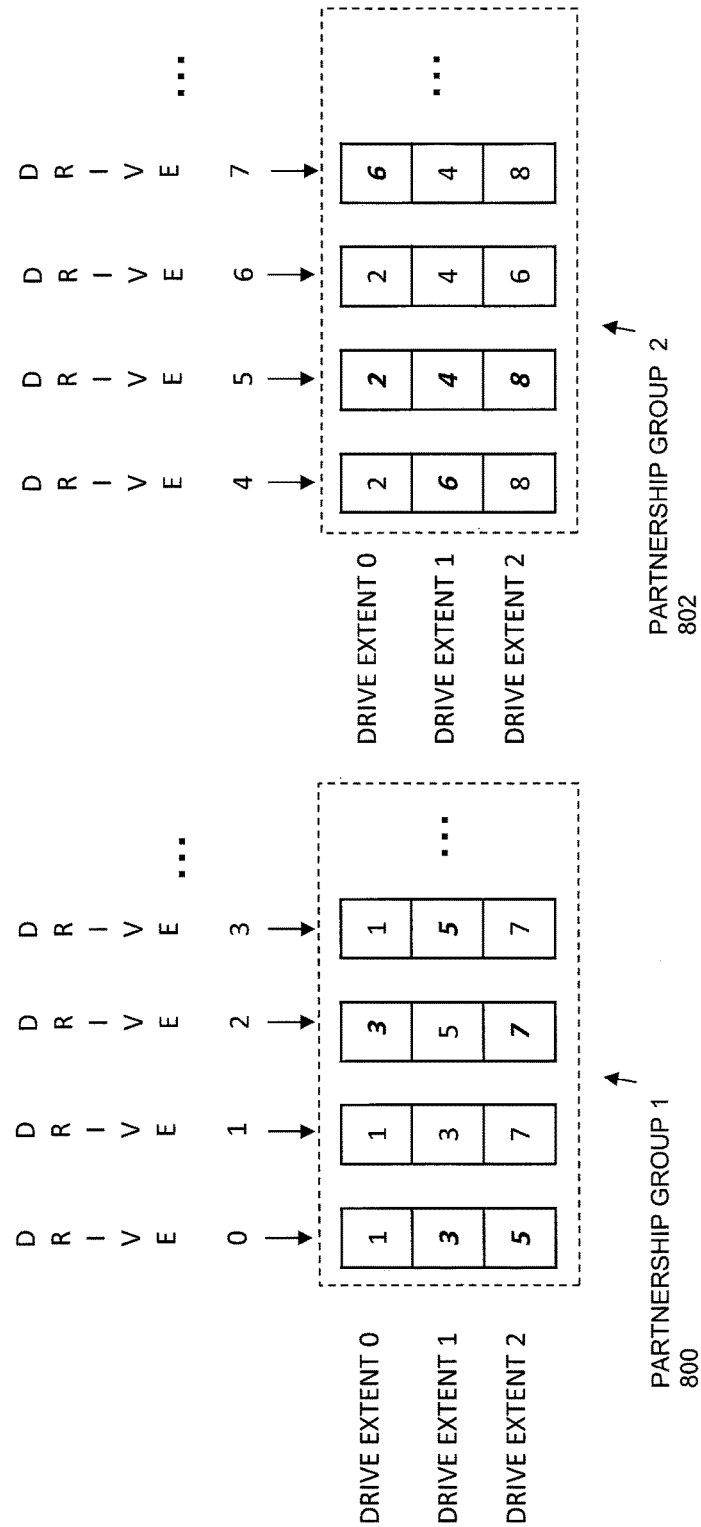
FIG. 8 is a block diagram showing partnership groups generated from the initial group of physical data storage drives shown in FIG. 7, and indicating changes made in the allocations of specific drive extents made to reflect the generated partnership groups.

In an example of operation, Initial Group of Physical Drives 700 is split into two partnership groups, shown in FIG. 8 by Partnership Group 1 800 and Partnership Group 2 802. Partnership Group 1 800 contains a set of physical data storage drives that includes Physical Data Storage Drive 0, Physical Data Storage Drive 1, Physical Data Storage Drive 2, and Physical Data Storage Drive 3. Partnership Group 2 802 contains a set of physical data storage drives that includes Physical Data Storage Drive 4, Physical Data Storage Drive 5, Physical Data Storage Drive 6, and Physical Data Storage Drive 7. Further in an example of operation, the RAID extents in the RAID mapping table may be divided into two RAID extent groups, i.e. a first RAID extent group to which RAID extents 1, 3, 5, and 7 are assigned, and a second RAID extent group to which RAID extents 2, 4, 6, and 8 were assigned. The first RAID extent group corresponds to Partnership Group 1 800, and the second RAID extent group corresponds to Partnership Group 2 802. The drive extent allocations that are italicized in FIG. 8 indicate allocation modifications that were performed while splitting the Initial Group of Physical Drives 700 into Partnership Group 1 800 and Partnership Group 2 802.

For example, as shown in FIG. 7, Drive Extent 1 of Physical Data Storage Drive 0 was allocated to RAID extent 4 prior to the split. However, as part of the process of splitting the RAID mapping table into RAID extent groups, RAID extent 4 was assigned to the second RAID extent group, which corresponds to Partnership Group 2 802. Accordingly, as shown in FIG. 8, the allocation of Drive Extent 1 of Physical Data Storage Drive 0 is modified during the splitting process such that after the split Drive Extent 1 of Physical Data Storage Drive 0 is allocated to RAID extent 3, which is part of the first RAID extent group.

In another example, as shown in FIG. 7, Drive Extent 2 of Physical Data Storage Drive 0 was allocated to RAID extent 6 prior to the split. However, as part of the process of splitting the RAID mapping table into RAID extent groups, RAID extent 6 was also assigned to the second RAID extent group, which corresponds to Partnership Group 2 802. Accordingly, as shown in FIG. 8, the allocation of Drive Extent 2 of Physical Data Storage Drive 0 is modified during the splitting process such that after the split Drive Extent 2 of Physical Data Storage Drive 0 is allocated to RAID extent 5, which is part of the first RAID extent group.

In another example, as shown in FIG. 7, Drive Extent 0 of Physical Data Storage Drive 2 was allocated to RAID extent 2 prior to the split. However, as part of the process of splitting the RAID mapping table into RAID extent groups, RAID extent 2 was assigned to the second RAID extent group, which corresponds to Partnership Group 2 802. Accordingly, as shown in FIG. 8, the allocation of Drive Extent 0 of Physical Data Storage Drive 2 is modified during the splitting process such that after the split Drive Extent 0 of Physical Data Storage Drive 2 is allocated to RAID extent 3, which is part of the first RAID extent group.

In another example, as shown in FIG. 7, Drive Extent 2 of Physical Data Storage Drive 2 was allocated to RAID extent 8 prior to the split. However, as part of the process of splitting the RAID mapping table into RAID extent groups, RAID extent 8 was assigned to the second RAID extent group, which corresponds to Partnership Group 2 802. Accordingly, as shown in FIG. 8, the allocation of Drive Extent 2 of Physical Data Storage Drive 2 is modified during the splitting process such that after the split Drive Extent 2 of Physical Data Storage Drive 2 is allocated to RAID extent 7, which is part of the first RAID extent group.

In another example, as shown in FIG. 7, Drive Extent 1 of Physical Data Storage Drive 3 was allocated to RAID extent 6 prior to the split. However, as part of the process of splitting the RAID mapping table into RAID extent groups, RAID extent 6 was assigned to the second RAID extent group, which corresponds to Partnership Group 2 802. Accordingly, as shown in FIG. 8, the allocation of Drive Extent 1 of Physical Data Storage Drive 3 is modified during the splitting process such that after the split Drive Extent 1 of Physical Data Storage Drive 3 is allocated to RAID extent 5, which is part of the first RAID extent group.

In another example, as shown in FIG. 7, Drive Extent 1 of Physical Data Storage Drive 4 was allocated to RAID extent 5 prior to the split. However, as part of the process of splitting the RAID mapping table into RAID extent groups, RAID extent 5 was assigned to the first RAID extent group, which corresponds to Partnership Group 1 800. Accordingly, as shown in FIG. 8, the allocation of Drive Extent 1 of Physical Data Storage Drive 4 is modified during the splitting process such that after the split Drive Extent 1 of Physical Data Storage Drive 4 is allocated to RAID extent 6, which is part of the second RAID extent group.

In another example, as shown in FIG. 7, Drive Extent 0 of Physical Data Storage Drive 5 was allocated to RAID extent 3 prior to the split. However, as part of the process of splitting the RAID mapping table into RAID extent groups, RAID extent 3 was assigned to the first RAID extent group, which corresponds to Partnership Group 1 800. Accordingly, as shown in FIG. 8, the allocation of Drive Extent 0 of Physical Data Storage Drive 5 is modified during the splitting process such that after the split Drive Extent 0 of Physical Data Storage Drive 5 is allocated to RAID extent 2, which is part of the second RAID extent group.

In another example, as shown in FIG. 7, Drive Extent 1 of Physical Data Storage Drive 5 was allocated to RAID extent 5 prior to the split. However, as part of the process of splitting the RAID mapping table into RAID extent groups, RAID extent 5 was assigned to the first RAID extent group, which corresponds to Partnership Group 1 800. Accordingly, as shown in FIG. 8, the allocation of Drive Extent 1 of Physical Data Storage Drive 5 is modified during the splitting process such that after the split Drive Extent 1 of Physical Data Storage Drive 5 is allocated to RAID extent 4, which is part of the second RAID extent group.

In another example, as shown in FIG. 7, Drive Extent 2 of Physical Data Storage Drive 5 was allocated to RAID extent 7 prior to the split. However, as part of the process of splitting the RAID mapping table into RAID extent groups, RAID extent 7 was assigned to the first RAID extent group, which corresponds to Partnership Group 1 800. Accordingly, as shown in FIG. 8, the allocation of Drive Extent 2 of Physical Data Storage Drive 5 is modified during the splitting process such that after the split Drive Extent 2 of Physical Data Storage Drive 5 is allocated to RAID extent 8, which is part of the second RAID extent group.

In another example, as shown in FIG. 7, Drive Extent 0 of Physical Data Storage Drive 7 was allocated to RAID extent 3 prior to the split. However, as part of the process of splitting the RAID mapping table into RAID extent groups, RAID extent 3 was assigned to the first RAID extent group, which corresponds to Partnership Group 1 800. Accordingly, as shown in FIG. 8, the allocation of Drive Extent 0 of Physical Data Storage Drive 7 is modified during the splitting process such that after the split Drive Extent 0 of Physical Data Storage Drive 7 is allocated to RAID extent 6, which is part of the second RAID extent group.

Figure 9:
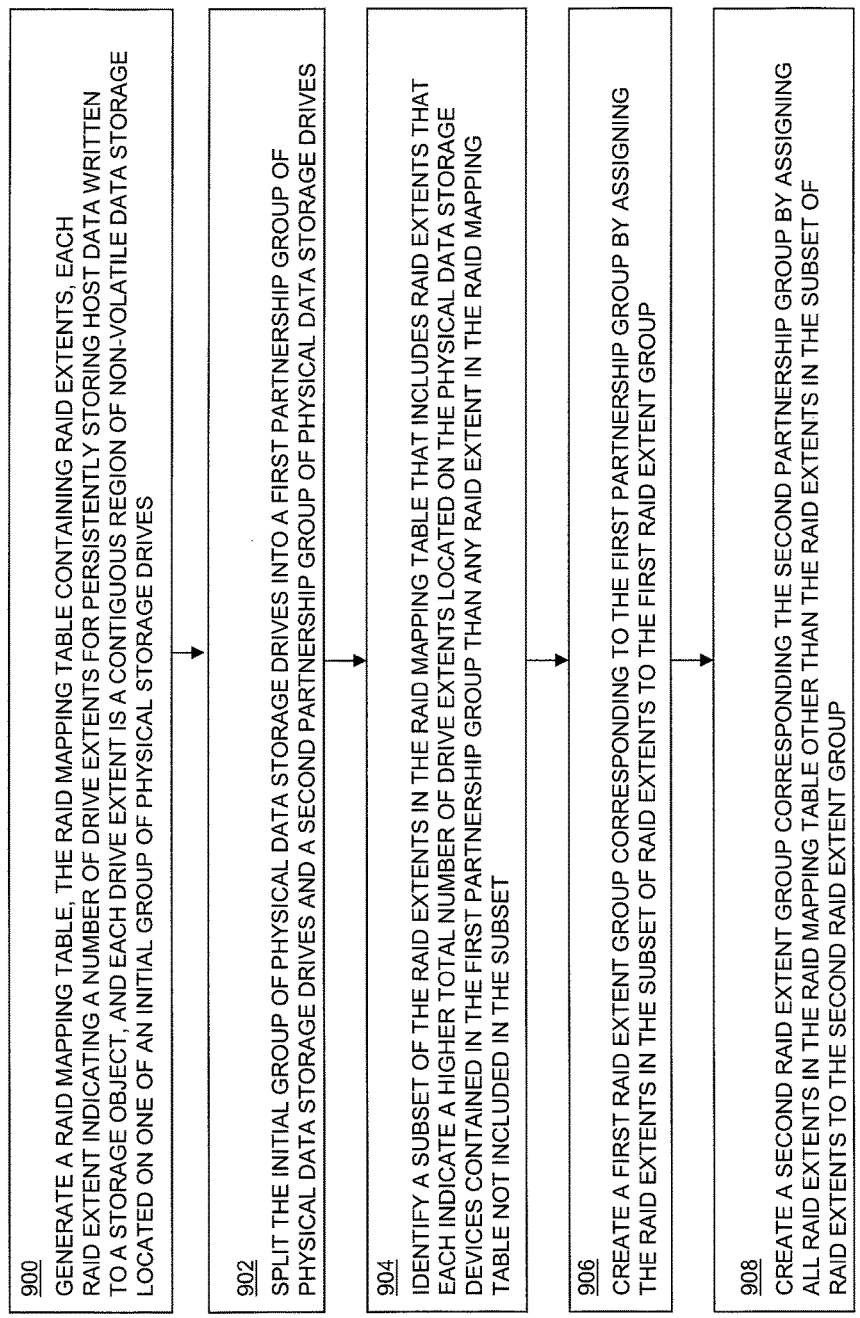
FIG. 9 is a flow chart showing an example of steps performed during operation of some embodiments of the disclosed technology to assign RAID extents to different RAID extent groups in response to splitting of an initial set of physical data storage drives into two partnership groups.

FIG. 9 is a flow chart showing an example of steps performed during operation of some embodiments of the disclosed technology to assign RAID extents to different RAID extent groups in response to splitting of an initial set of physical data storage drives into two partnership groups. The steps of FIG. 9 may, for example, be performed by the Drive Group Splitting Logic 156 shown in FIG. 1.

At step 900, a RAID mapping table is generated that contains RAID extents, each RAID extent indicating a number of drive extents that are used to persistently store host data written to a storage object. Each drive extent is a contiguous region of non-volatile data storage located on one of an initial group of physical storage drives.

At step 902, the initial group of physical data storage drives is split into a first partnership group of physical data storage drives and a second partnership group of physical data storage drives.

At step 904 a subset of the RAID extents in the RAID mapping table is identified. The subset includes RAID extents that each indicate a higher total number of drive extents located on the physical data storage devices contained in the first partnership group than any RAID extent in the raid mapping table not included in the subset.

At step 906 a first RAID extent group is created that corresponds to the first partnership group. The first RAID extent group is created by assigning the RAID extents in the subset of RAID extents to the first RAID extent group.

At step 908, a second RAID extent group is created that corresponds to the second partnership group. The second RAID extent group is created by assigning all raid extents in the RAID mapping table other than the RAID extents in the subset of RAID extents to the second RAID extent group.

Figure 10:
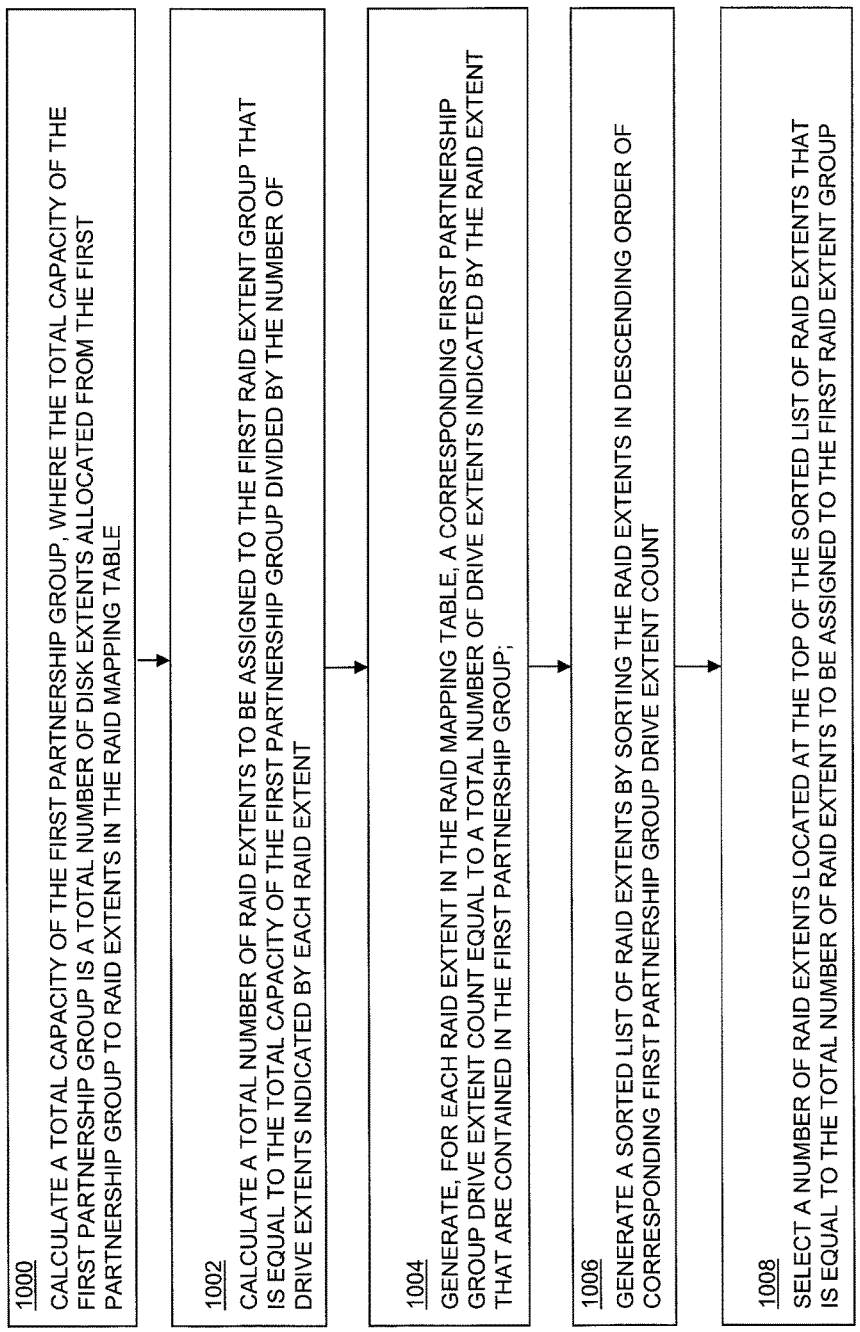
FIG. 10 is a flow chart showing an example of steps performed in some embodiments to identify a subset of the RAID extents in the RAID mapping table that includes a number of RAID extents that each indicate a higher total number of drive extents located in the physical data storage devices contained in the first partnership group than any RAID extent in the RAID mapping table not included in the subset.

FIG. 10 is a flow chart showing an example of steps performed in some embodiments to identify a subset of the RAID extents in the RAID mapping table that includes a number of RAID extents that each indicate a higher total number of drive extents located in the physical data storage devices contained in the first partnership group than any RAID extent in the RAID mapping table not included in the subset, as in step 904 of FIG. 9. The steps of FIG. 10 may, for example, be performed by the Drive Group Splitting Logic 156 shown in FIG. 1.

At step 1000, a total capacity of the first partnership group is calculated. The total capacity of the first partnership group is equal to a total number of disk extents allocated from the first partnership group to RAID extents in the RAID mapping table.

At step 1002, a total number of RAID extents that are to be assigned to the first RAID extent group is calculated. The total number of RAID extents that are to be assigned to the first RAID extent group is equal to the total capacity of the first partnership group divided by the number of drive extents indicated by each RAID extent.

At step 1004, for each raid extent in the RAID mapping table, a corresponding first partnership group drive extent count is generated that is equal to a total number of drive extents indicated by the RAID extent that are contained in the first partnership group.

Figure 11:
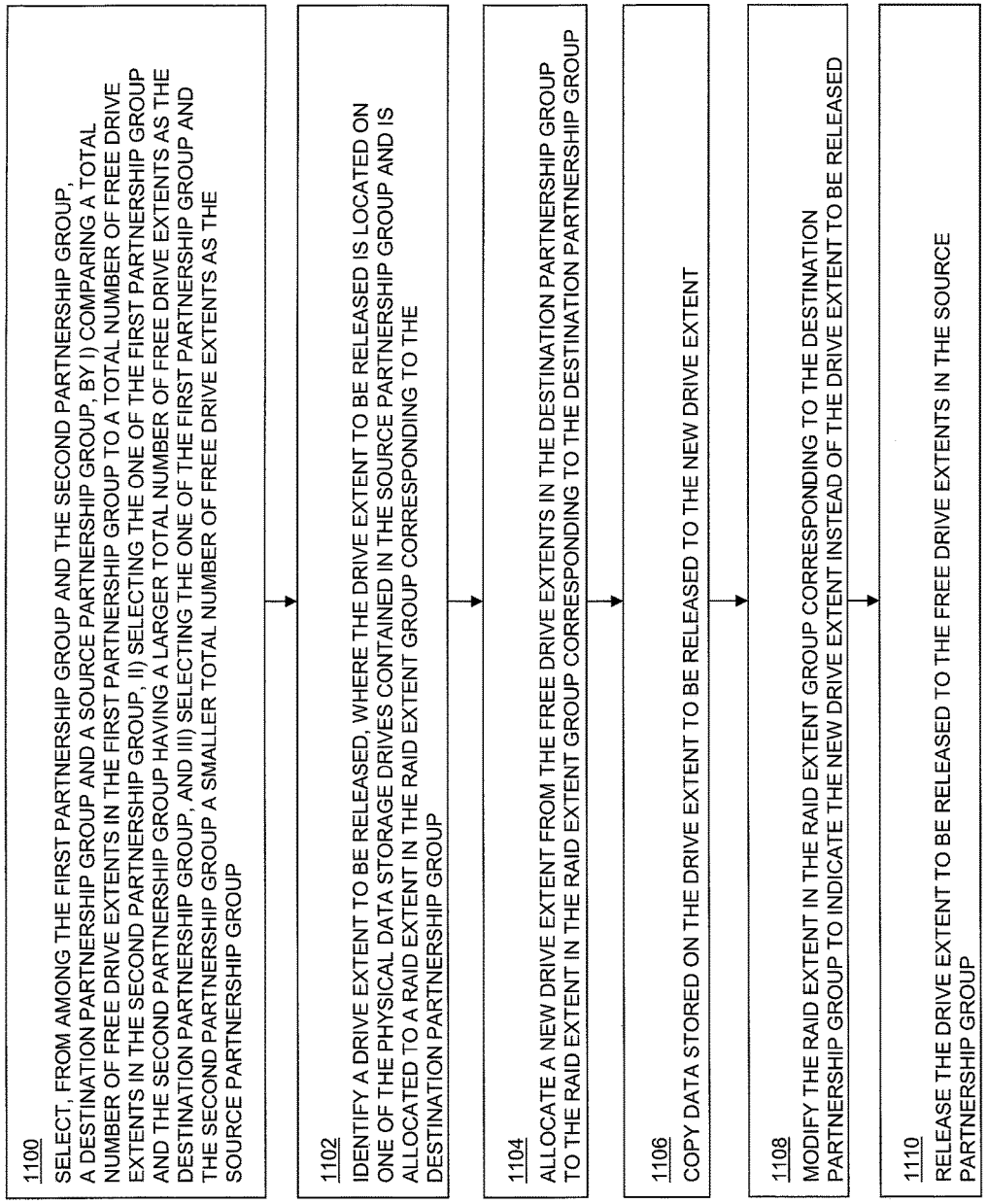
FIG. 11 is a flow chart showing an example of steps performed in some embodiments to modify at least one drive extent indication in at least one of the RAID extents to reflect the splitting of an initial group of physical data storage drives into a first partnership group and a second partnership group.

FIG. 11 is a flow chart showing an example of steps performed in some embodiments to modify at least one drive extent indication in at least one of the RAID extents to reflect the splitting of an initial group of physical data storage drives into a first partnership group and a second partnership group. The steps of FIG. 11 may, for example be performed by Drive Group Splitting Logic 156 after performing the steps of FIGS. 9 and 10.

At step 1100, a destination partnership group and a source partnership group are selected from among the first partnership group and the second partnership group by i) comparing a total number of free drive extents in the first partnership group to a total number of free drive extents in the second partnership group, ii) selecting the one of the first partnership group and the second partnership group having a larger total number of free drive extents as the destination partnership group, and iii) selecting the one of the first partnership group and the second partnership group having a smaller total number of free drive extents as the source partnership group.

At step 1102 a drive extent to be released is identified. The drive extent that is identified as the drive extent to be released at step 1102 is located on one of the physical data storage drives contained in the source partnership group and is allocated to a RAID extent in the RAID extent group corresponding to the destination partnership group.

At step 1104, a new drive extent is allocated from the free drive extents in the destination partnership group to the RAID extent in the RAID extent group corresponding to the destination partnership group.

At step 1106, data stored on the drive extent to be released is copied to the new drive extent.

At step 1108, the RAID extent in the RAID extent group corresponding to the destination partnership group is modified to indicate the new drive extent instead of the drive extent to be released.

At step 1110, the drive extent to be released is released (i.e. deallocated) and added to the free drive extents in the source partnership group.

Figure 12:
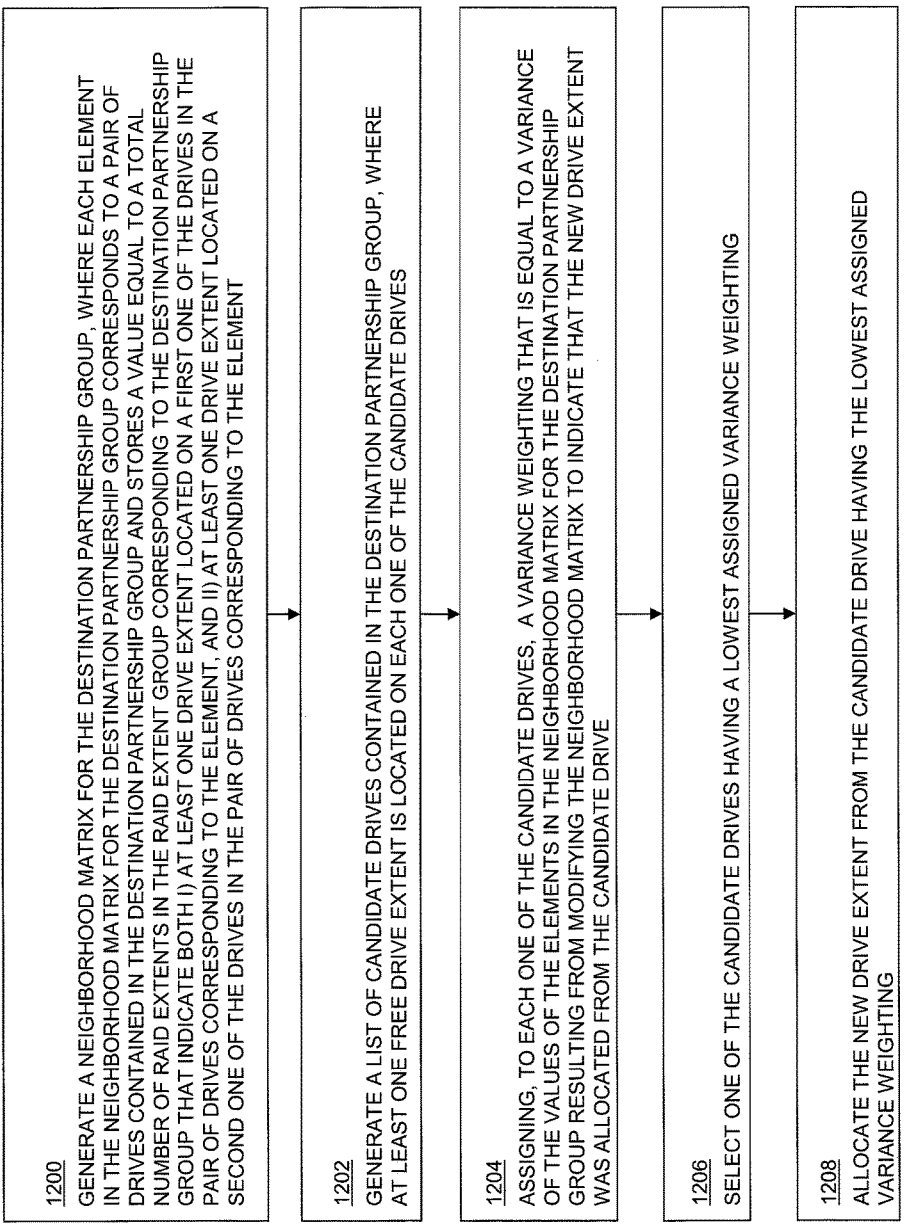
FIG. 12 is a flow chart showing an example of steps performed in some embodiments to allocate a new drive extent from the free drive extents in a destination partnership group.

FIG. 12 is a flow chart showing an example of steps performed in some embodiments to allocate a new drive extent from the free drive extents in a destination partnership group. The steps of FIG. 12 are, for example, performed by the Drive Group Splitting Logic 156 shown in FIG. 1, e.g. as part of performing step 1104 in FIG. 11.

At step 1200, a neighborhood matrix is generated for the destination partnership group. Each element in the neighborhood matrix for the destination partnership group corresponds to a pair of physical data storage drives contained in the destination partnership group, and stores a value equal to a total number of RAID extents in the RAID extent group corresponding to the destination partnership group that indicate both i) at least one drive extent located on a first one of the drives in the pair of drives corresponding to the element, and ii) at least one drive extent located on a second one of the drives in the pair of drives corresponding to the element.

At step 1202, a list of candidate drives contained in the destination partnership group is generated. Each candidate drive in the list of candidate drives has at least one free drive extent located on it.

At step 1204, a variance weighting is assigned to each one of the candidate drives. The variance weighting assigned to a variance drive is equal to a variance of the values stored in the elements of the neighborhood matrix for the destination partnership group that would result from modifying the neighborhood matrix to indicate that the new drive extent was allocated from that candidate drive.

At step 1206, one of the candidate drives is selected that has the lowest assigned variance weighting.

At step 1208, the new drive extent is allocated from the candidate drive having the lowest assigned variance weighting.

Figure 13:
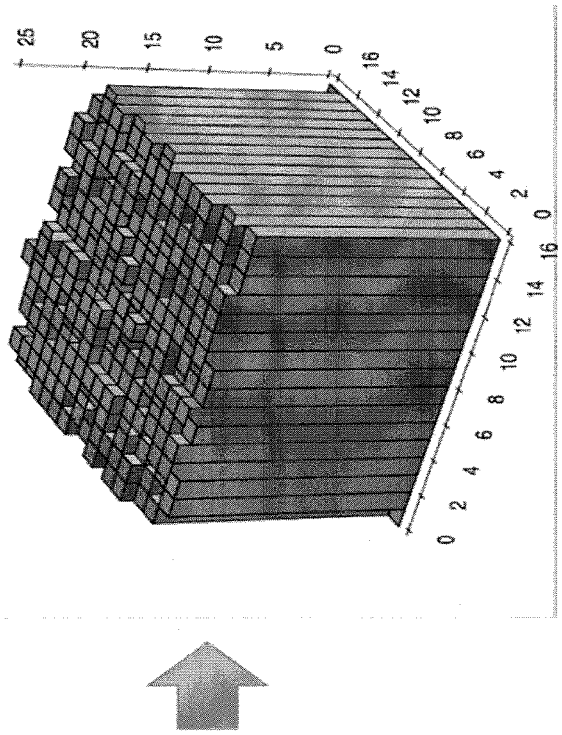
FIG. 13 shows an example of values in a partnership group matrix having a low variance and a graphical representation of the those values, as may advantageously be provided using some embodiments of the disclosed techniques.

FIG. 13 shows an example of Values 1300 in the elements of a partnership group neighborhood matrix having a low variance, and a Graphical Representation 1302 of the Values 1300. The partnership group corresponding to the Values 1300 and the Graphical Representation 1302 has, for example, 16 physical data storage drives. The Graphical Representation 1302 illustrates that when the values in the elements of a partnership group neighborhood matrix have a low variance, then the corresponding graphical representation is significantly flat. In some embodiments, while modifying at least one drive extent indication in at least one of the RAID extents in a RAID extent group to reflect the splitting of the initial group of physical data storage drives into a first partnership group and a second partnership group, the disclosed techniques allocate at least one new drive extent to replace at least one drive extent located outside of a corresponding partnership group such that a resulting variance in the values of the elements in a neighborhood matrix for the partnership group is kept low, as illustrated in FIG. 13. As a result, some embodiments of the disclosed technology may provide a high level of rebuild performance by ensuring that RAID extents are evenly distributed across the drives in the partnership group, so that large numbers of storage drives are able to participate in the drive rebuilding process in the event of a drive failure in the partnership group.

Figure 14:
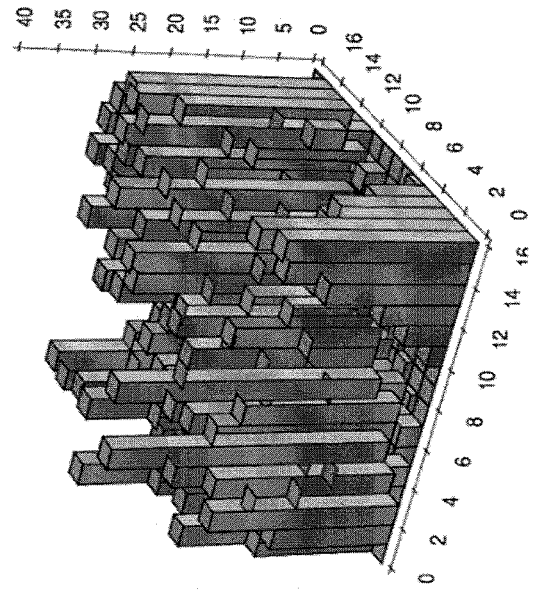
FIG. 14 shows an example of values in a partnership group matrix having a high variance and a graphical representation of those values.

FIG. 14 shows a contrasting example of Values 1400 in the elements of a partnership group neighborhood matrix having a high variance, and a Graphical Representation 1402 of the Values 1400. The partnership group corresponding to the Values 1400 and the Graphical Representation 1402 also has, for example, 16 physical data storage drives. The Graphical Representation 1402 illustrates that when the values in the elements of a partnership group neighborhood matrix have a high variance, then the corresponding graphical representation is significantly not flat. Without using the techniques disclosed herein while modifying at least one drive extent indication in at least one of the RAID extents in a RAID extent group to reflect the splitting of the initial group of physical data storage drives into a first partnership group and a second partnership group, new drive extents may be allocated to replace drive extents located outside of a corresponding partnership group such that a resulting variance in the values of the elements in a neighborhood matrix for the partnership group is high, as illustrated in FIG. 14. A low level of rebuild performance may accordingly result because smaller numbers of storage drives are able to participate in the drive rebuilding process in the event of a drive failure in the partnership group.

As will be appreciated by one skilled in the art, aspects of the technologies disclosed herein may be embodied as a system, method or computer program product. Accordingly, each specific aspect of the present disclosure may be embodied using hardware, software (including firmware, resident software, micro-code, etc.) or a combination of software and hardware. Furthermore, aspects of the technologies disclosed herein may take the form of a computer program product embodied in one or more non-transitory computer readable storage medium(s) having computer readable program code stored thereon for causing a processor and/or computer system to carry out those aspects of the present disclosure.

Any combination of one or more computer readable storage medium(s) may be utilized. The computer readable storage medium may be, for example, but not limited to, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any non-transitory tangible medium that can contain, or store a program for use by or in connection with an instruction execution system, apparatus, or device.

The figures include block diagram and flowchart illustrations of methods, apparatus(s) and computer program products according to one or more embodiments of the invention. It will be understood that each block in such figures, and combinations of these blocks, can be implemented by computer program instructions. These computer program instructions may be executed on processing circuitry to form specialized hardware. These computer program instructions may further be loaded onto a computer or other programmable data processing apparatus to produce a machine, such that the instructions which execute on the computer or other programmable data processing apparatus create means for implementing the functions specified in the block or blocks. These computer program instructions may also be stored in a computer-readable memory that can direct a computer or other programmable data processing apparatus to function in a particular manner, such that the instructions stored in the computer-readable memory produce an article of manufacture including instruction means which implement the function specified in the block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the block or blocks.

Those skilled in the art should also readily appreciate that programs defining the functions of the present invention can be delivered to a computer in many forms; including, but not limited to: (a) information permanently stored on non-writable storage media (e.g. read only memory devices within a computer such as ROM or CD-ROM disks readable by a computer I/O attachment); or (b) information alterably stored on writable storage media (e.g. floppy disks and hard drives).

While the invention is described through the above exemplary embodiments, it will be understood by those of ordinary skill in the art that modification to and variation of the illustrated embodiments may be made without departing from the inventive concepts herein disclosed.

What is claimed is:

1. A method of providing RAID (Redundant Array of Independent Disks) data protection for a storage object in a data storage system, wherein the data storage system includes a storage processor and an initial group of physical data storage drives communicably coupled to the storage processor, the method comprising:
   generating a RAID mapping table, wherein the RAID mapping table contains a plurality of RAID extents, wherein each RAID extent contained in the RAID mapping table indicates a predetermined number of drive extents for persistently storing host data written to the storage object, and wherein each drive extent comprises a contiguous region of non-volatile data storage located on one of the physical storage drives;
   splitting the initial group of physical data storage drives into a first partnership group of physical data storage drives and a second partnership group of physical data storage drives;
   identifying a subset of the RAID extents in the RAID mapping table that consists of a plurality of RAID extents that each indicate a higher total number of drive extents located on the physical data storage devices contained in the first partnership group than any RAID extent in the RAID mapping table not included in the subset;
   creating a first RAID extent group corresponding to the first partnership group by assigning the RAID extents in the subset of RAID extents to the first RAID extent group; and
   creating a second RAID extent group corresponding the second partnership group by assigning all RAID extents in the RAID mapping table other than the RAID extents in the subset of RAID extents to the second RAID extent group.

2. The method of claim 1, wherein identifying the subset of the RAID extents in the RAID mapping table that consists of the plurality of RAID extents that each indicate a higher total number of drive extents located in the physical data storage devices contained in the first partnership group than any RAID extent in the RAID mapping table not included in the subset comprises:
   calculating a total capacity of the first partnership group, wherein the total capacity of the first partnership group comprises a total number of disk extents allocated from the first partnership group to RAID extents in the RAID mapping table;
   calculating a total number of RAID extents to be assigned to the first RAID extent group that is equal to the total capacity of the first partnership group divided by the number of drive extents indicated by each RAID extent;
   generating, for each RAID extent in the RAID mapping table, a corresponding first partnership group drive extent count equal to a total number of drive extents indicated by the RAID extent that are contained in the first partnership group;
   generating a sorted list of RAID extents by sorting the RAID extents in descending order of corresponding first partnership group drive extent count; and
   selecting a number of RAID extents located at the top of the sorted list of RAID extents that is equal to the total number of RAID extents to be assigned to the first RAID extent group.

3. The method of claim 2, further comprising modifying at least one drive extent indication in at least one of the RAID extents to reflect the splitting of the initial group of physical data storage drives into the first partnership group and the second partnership group by:
   selecting, from among the first partnership group and the second partnership group, a destination partnership group and a source partnership group, by i) comparing a total number of free drive extents in the first partnership group to a total number of free drive extents in the second partnership group, ii) selecting the one of the first partnership group and the second partnership group having a larger total number of free drive extents as the destination partnership group, and iii) selecting the one of the first partnership group and the second partnership group having a smaller total number of free drive extents as the source partnership group;
   identifying a drive extent to be released, wherein the drive extent to be released is located on one of the physical data storage drives contained in the source partnership group and is allocated to a RAID extent in the RAID extent group corresponding to the destination partnership group;
   allocating a new drive extent from the free drive extents in the destination partnership group to the RAID extent in the RAID extent group corresponding to the destination partnership group;
   copying data stored on the drive extent to be released to the new drive extent;
   modifying the RAID extent in the RAID extent group corresponding to the destination partnership group to indicate the new drive extent instead of the drive extent to be released; and
   releasing the drive extent to be released to the free drive extents in the source partnership group.

4. The method of claim 3, wherein allocating the new drive extent from the free drive extents in the destination partnership group includes:
   generating a neighborhood matrix for the destination partnership group, wherein each element in the neighborhood matrix for the destination partnership group corresponds to a pair of drives contained in the destination partnership group and stores a value equal to a total number of RAID extents in the RAID extent group corresponding to the destination partnership group that indicate both i) at least one drive extent located on a first one of the drives in the pair of drives corresponding to the element, and ii) at least one drive extent located on a second one of the drives in the pair of drives corresponding to the element;
   generating a list of candidate drives contained in the destination partnership group, wherein each one of the candidate drives has located thereon at least one free drive extent;
   assigning, to each one of the candidate drives, a variance weighting that is equal to a variance of the values of the elements in the neighborhood matrix for the destination partnership group resulting from modifying the neighborhood matrix to indicate that the new drive extent was allocated from the candidate drive;
   selecting one of the candidate drives having a lowest assigned variance weighting; and
   allocating the new drive extent from the candidate drive having the lowest assigned variance weighting.

5. The method of claim 4, further comprising:
   detecting the addition of a new physical data storage drive to the data storage system;
   in response to detecting the addition of the new physical data storage drive to the data storage system, comparing a total number of physical data storage drives in the data storage system to a predetermined maximum drive group size; and wherein splitting the initial group of physical data storage drives into the first partnership group of physical data storage drives and the second partnership group of physical data storage drives is performed in response to detecting that the total number of physical data storage drives in the data storage system exceeds the maximum drive group size.

6. The method of claim 5, wherein each RAID extent in the RAID mapping table indicates the same number of drive extents;

wherein a minimum number of physical data storage drives required to provide RAID data protection for the storage object in the data storage system is greater than the number of drive extents indicated by each RAID extent in the RAID mapping table; and wherein the maximum drive group size is at least twice as large as the minimum number of physical data storage drives required to provide RAID data protection for the storage object in a data storage system.

7. The method claim 6, wherein splitting the group of physical data storage drives into the first partnership group of physical data storage drives and the second partnership group of physical data storage drives comprises dividing the group of physical data storage drives into a first partnership group of physical data storage drives comprising a first half of the physical data storage drives in the group of physical data storage drives and a second partnership group of physical data storage drives comprising a second half of the physical data storage drives in the group of physical data storage drives.

8. The method of claim 7, wherein a plurality of unallocated drive extents located in physical data storage drives contained in the first partnership group of physical data storage drives are available as free drive extents to be allocated, in response to detecting a failure of a physical data storage drive contained in the first partnership group of physical data storage drives, to one or more RAID extents in the first RAID extent group, to replace drive extents located in the failed physical data storage drive contained in the first partnership group of physical data storage devices; and wherein a plurality of unallocated drive extents located in physical data storage drives contained in the second partnership group of physical storage drives are available as free drive extents to be allocated, in response to detecting a failure of a physical data storage drive contained in the second partnership group of physical data storage drives, to one or more RAID extents in the second RAID extent group, to replace drive extents located in the failed physical data storage drive contained in the second partnership group of physical data storage drives.

9. The method of claim 8, wherein drive extents are allocated to RAID extents in the RAID mapping table such that no two drive extents indicated by any single RAID extent are located on the same physical data storage drive.

10. A data storage system that provides RAID (Redundant Array of Independent Disks) data protection for a storage object, comprising:

at least one storage processor including processing circuitry and a memory;

a set of physical data storage drives communicably coupled to the storage processor; and wherein the storage processor is configured and arranged to:

generate a RAID mapping table, wherein the RAID mapping table contains a plurality of RAID extents, wherein each RAID extent contained in the RAID mapping table indicates a predetermined number of drive extents for persistently storing host data written to the storage object, and wherein each drive extent comprises a contiguous region of non-volatile data storage located on one of the physical storage drives, split the initial group of physical data storage drives into a first partnership group of physical data storage drives and a second partnership group of physical data storage drives, identify a subset of the RAID extents in the RAID mapping table that consists of a plurality of RAID extents that each indicate a higher total number of drive extents located on the physical data storage devices contained in the first partnership group than any RAID extent in the RAID mapping table not included in the subset, create a first RAID extent group corresponding to the first partnership group by assigning the RAID extents in the subset of RAID extents to the first RAID extent group, and create a second RAID extent group corresponding the second partnership group by assigning all RAID extents in the RAID mapping table other than the RAID extents in the subset of RAID extents to the second RAID extent group.

11. The data storage system of claim 10, wherein to identify the subset of the RAID extents in the RAID mapping table that consists of the plurality of RAID extents that each indicate a higher total number of drive extents located in the physical data storage devices contained in the first partnership group than any RAID extent in the RAID mapping table not included in the subset, the storage processor is further configured and arranged to:

calculate a total capacity of the first partnership group, wherein the total capacity of the first partnership group comprises a total number of disk extents allocated from the first partnership group to RAID extents in the RAID mapping table;

calculate a total number of RAID extents to be assigned to the first RAID extent group that is equal to the total capacity of the first partnership group divided by the number of drive extents indicated by each RAID extent;

generate, for each RAID extent in the RAID mapping table, a corresponding first partnership group drive extent count equal to a total number of drive extents indicated by the RAID extent that are contained in the first partnership group;

generate a sorted list of RAID extents by sorting the RAID extents in descending order of corresponding first partnership group drive extent count; and select a number of RAID extents located at the top of the sorted list of RAID extents that is equal to the total number of RAID extents to be assigned to the first RAID extent group.

12. The data storage system of claim 11, further comprising:

wherein the storage processor is further configured and arranged to modify at least one drive extent indication in at least one of the RAID extents to reflect the splitting of the initial group of physical data storage drives into the first partnership group and the second partnership group; and wherein to modify at least one drive extent indication in at least one of the RAID extents to reflect the splitting of the initial group of physical data storage drives into the first partnership group and the second partnership group, the storage processor is further configured and arranged to:

select, from among the first partnership group and the second partnership group, a destination partnership group and a source partnership group, by i) comparing a total number of free drive extents in the first partnership group to a total number of free drive extents in the second partnership group, ii) selecting the one of the first partnership group and the second partnership group having a larger total number of free drive extents as the destination partnership group, and iii) selecting the one of the first partnership group and the second partnership group having a smaller total number of free drive extents as the source partnership group, identify a drive extent to be released, wherein the drive extent to be released is located on one of the physical data storage drives contained in the source partnership group and is allocated to a RAID extent in the RAID extent group corresponding to the destination partnership group, allocate a new drive extent from the free drive extents in the destination partnership group to the RAID extent in the RAID extent group corresponding to the destination partnership group, copy data stored on the drive extent to be released to the new drive extent, modify the RAID extent in the RAID extent group corresponding to the destination partnership group to indicate the new drive extent instead of the drive extent to be released, and release the drive extent to be released to the free drive extents in the source partnership group.

13. The data storage system of claim 12, wherein to allocate the new drive extent from the free drive extents in the destination partnership group, the storage processor is further configured and arranged to:

generate a neighborhood matrix for the destination partnership group, wherein each element in the neighborhood matrix for the destination partnership group corresponds to a pair of drives contained in the destination partnership group and stores a value equal to a total number of RAID extents in the RAID extent group corresponding to the destination partnership group that indicate both i) at least one drive extent located on a first one of the drives in the pair of drives corresponding to the element, and ii) at least one drive extent located on a second one of the drives in the pair of drives corresponding to the element;

generate a list of candidate drives contained in the destination partnership group, wherein each one of the candidate drives has located thereon at least one free drive extent;

assign, to each one of the candidate drives, a variance weighting that is equal to a variance of the values of the elements in the neighborhood matrix for the destination partnership group resulting from modifying the neighborhood matrix to indicate that the new drive extent was allocated from the candidate drive;

select one of the candidate drives having a lowest assigned variance weighting; and allocate the new drive extent from the candidate drive having the lowest assigned variance weighting.

14. The data storage system of claim 13, wherein the storage processor is further configured and arranged to:

detect the addition of a new physical data storage drive to the data storage system;

in response to detection of the addition of the new physical data storage drive to the data storage system, compare a total number of physical data storage drives in the data storage system to a predetermined maximum drive group size; and wherein the split of the initial group of physical data storage drives into the first partnership group of physical data storage drives and the second partnership group of physical data storage drives is performed in response to the total number of physical data storage drives in the data storage system exceeding the maximum drive group size.

15. The data storage system of claim 14, wherein each RAID extent in the RAID mapping table indicates the same number of drive extents;

wherein a minimum number of physical data storage drives required to provide RAID data protection for the storage object in the data storage system is greater than the number of drive extents indicated by each RAID extent in the RAID mapping table; and wherein the maximum drive group size is at least twice as large as the minimum number of physical data storage drives required to provide RAID data protection for the storage object in a data storage system.

16. The data storage system of claim 15, wherein to split the group of physical data storage drives into the first partnership group of physical data storage drives and the second partnership group of physical data storage drives, the storage processor is further configured and arranged to divide the group of physical data storage drives into a first partnership group of physical data storage drives comprising a first half of the physical data storage drives in the group of physical data storage drives and a second partnership group of physical data storage drives comprising a second half of the physical data storage drives in the group of physical data storage drives.

17. The data storage system of claim 16, wherein a plurality of unallocated drive extents located in physical data storage drives contained in the first partnership group of physical data storage drives are available as free drive extents to be allocated, in response to detection of a failure of a physical data storage drive contained in the first partnership group of physical data storage drives, to one or more RAID extents in the first RAID extent group, to replace drive extents located in the failed physical data storage drive contained in the first partnership group of physical data storage devices; and wherein a plurality of unallocated drive extents located in physical data storage drives contained in the second partnership group of physical storage drives are available as free drive extents to be allocated, in response to detection of a failure of a physical data storage drive contained in the second partnership group of physical data storage drives, to one or more RAID extents in the second RAID extent group, to replace drive extents located in the failed physical data storage drive contained in the second partnership group of physical data storage drives.

18. The data storage system of claim 17, wherein drive extents are allocated to RAID extents in the RAID mapping table such that no two drive extents indicated by any single RAID extent are located on the same physical data storage drive.

19. A computer program product, comprising:

a non-transitory computer readable medium storing program code for providing RAID (Redundant Array of Independent Disks) data protection for a storage object in a data storage system, wherein the data storage system includes a storage processor and a set of non-volatile data storage devices communicably coupled to the storage processor, the set of instructions, when carried out by at least one processor in the storage processor, causing the storage processor to perform a method of:

generating a RAID mapping table, wherein the RAID mapping table contains a plurality of RAID extents, wherein each RAID extent contained in the RAID mapping table indicates a predetermined number of drive extents for persistently storing host data written to the storage object, and wherein each drive extent comprises a contiguous region of non-volatile data storage located on one of the physical storage drives;

splitting the initial group of physical data storage drives into a first partnership group of physical data storage drives and a second partnership group of physical data storage drives;

identifying a subset of the RAID extents in the RAID mapping table that consists of a plurality of RAID extents that each indicate a higher total number of drive extents located on the physical data storage devices contained in the first partnership group than any RAID extent in the RAID mapping table not included in the subset;

creating a first RAID extent group corresponding to the first partnership group by assigning the RAID extents in the subset of RAID extents to the first RAID extent group; and creating a second RAID extent group corresponding the second partnership group by assigning all RAID extents in the RAID mapping table other than the RAID extents in the subset of RAID extents to the second RAID extent group.

\* \* \* \* \*